(12) United States Patent
Kwon et al.

(10) Patent No.: US 10,379,625 B2
(45) Date of Patent: Aug. 13, 2019

(54) METHOD FOR DISPLAYING SCREEN IN ELECTRONIC DEVICE AND ELECTRONIC DEVICE THEREOF

(71) Applicant: Samsung Electronics Co., Ltd., Suwon-si, Gyeonggi-do (KR)

(72) Inventors: Choel Hwi Kwon, Daegu (KR); Hyun Suk Choi, Daegu (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/887,119

(22) Filed: Feb. 2, 2018

(65) Prior Publication Data

US 2018/0224949 A1 Aug. 9, 2018

(30) Foreign Application Priority Data

Feb. 7, 2017 (KR) ........................ 10-2017-0017022

(51) Int. Cl.
*G06F 1/16* (2006.01)
*G06F 3/02* (2006.01)
(Continued)

(52) U.S. Cl.
CPC .......... *G06F 3/0227* (2013.01); *G06F 1/1626* (2013.01); *G06F 3/038* (2013.01); *G06F 3/039* (2013.01); *G06F 3/0383* (2013.01); *G06F 3/03545* (2013.01); *G06F 3/046* (2013.01); *G06F 3/0416* (2013.01); *G06F 3/0418* (2013.01); *H04M 1/72569* (2013.01); *H05K 5/0004* (2013.01); *H05K 5/0086* (2013.01);
(Continued)

(58) Field of Classification Search
None
See application file for complete search history.

(56) References Cited

U.S. PATENT DOCUMENTS

| 9,430,052 B2 | 8/2016 | Hong et al. |
| 9,742,456 B2 | 8/2017 | Park et al. |

(Continued)

FOREIGN PATENT DOCUMENTS

| KR | 10-2014-0125218 A | 10/2014 |
| KR | 10-2015-0016788 A | 2/2015 |

(Continued)

OTHER PUBLICATIONS

International Search Report dated May 18, 2018 in connection with International Patent Application No. PCT/KR2018/001342.

*Primary Examiner* — Nicholas J Lee

(57) ABSTRACT

An electronic device includes a housing, a display, an electromagnetic induction panel including a first channel group corresponding to a first direction and a second channel group corresponding to a second direction perpendicular to the first direction, and sensing a first signal flowing into the first channel group and a second signal flowing into the second channel group, and a processor and electrically connected to the electromagnetic induction panel. The processor is configured, if a combination of at least one first channel, in which it is sensed that a magnitude of the first signal is not greater than a first critical value, in the first channel group and at least one second channel, in which it is sensed that a magnitude of the second signal is not greater than a second critical value, in the second channel group corresponds to one of predefined channel combinations, to perform a preset operation.

20 Claims, 30 Drawing Sheets

(51) Int. Cl.
    *G06F 3/041* (2006.01)
    *G06F 3/046* (2006.01)
    *G06F 3/0354* (2013.01)
    *H05K 5/02* (2006.01)
    *H04M 1/725* (2006.01)
    *H05K 5/00* (2006.01)
    *G06F 3/038* (2013.01)
    *G06F 3/039* (2013.01)
    *H04B 1/3888* (2015.01)

(52) U.S. Cl.
    CPC ......... *H05K 5/0217* (2013.01); *H04B 1/3888* (2013.01); *H04M 1/72575* (2013.01)

(56) References Cited

U.S. PATENT DOCUMENTS

| | | |
|---|---|---|
| 2014/0313171 A1 | 10/2014 | Hong et al. |
| 2015/0035771 A1 | 2/2015 | Park et al. |
| 2015/0057050 A1 | 2/2015 | Park et al. |
| 2015/0119114 A1 | 4/2015 | Smith et al. |
| 2015/0227260 A1 | 8/2015 | Kuo |
| 2016/0241687 A1 | 8/2016 | Son |
| 2016/0275648 A1 | 9/2016 | Honda et al. |

FOREIGN PATENT DOCUMENTS

| | | |
|---|---|---|
| KR | 10-2015-0023120 A | 3/2015 |
| KR | 10-2015-0081394 A | 7/2015 |
| KR | 10-2015-0085246 A | 7/2015 |
| KR | 10-2016-0016412 A | 2/2016 |
| KR | 10-2016-0100874 A | 8/2016 | ual functions of the electronic device, a technology for implementing various functions with the cover has been developed.

METHOD FOR DISPLAYING SCREEN IN ELECTRONIC DEVICE AND ELECTRONIC DEVICE THEREOF

CROSS-REFERENCE TO RELATED APPLICATION AND CLAIM OF PRIORITY

This application is related to and claims priority to Korean Patent Application NO. 10-2017-0017022, filed on Feb. 7, 2017, the contents of which are incorporated herein by reference.

TECHNICAL FIELD

The present disclosure relates to a technology for displaying a screen of an electronic device.

BACKGROUND

The cover of an electronic device such as a smartphone, a tablet personal computer (PC), or the like may be used to safely protect the electronic device from external shock. Also, the cover has been recently used as an accessory that expresses the personality of a user. In addition, with the development of a technology for implementing various functions of the electronic device, a technology for implementing various functions with the cover has been developed.

The electronic device may include a connector that connects the electronic device to the cover, and may determine whether the cover is mounted, based on a voltage level of a specific terminal of the connector. The opening/closing state of the cover after the cover is mounted may be determined by using a hall effect integrated circuit (IC) that determines whether a magnet located in the cover approaches the electronic device.

SUMMARY

To address the above-discussed deficiencies, it is a primary object to provide an electronic device that may include a connector for determining whether an accessory is mounted, and may include a general purpose input output (GPIO) or an analog digital converter (ADC) port capable of determining the electrical state of the terminal of the connector. In addition, the electronic device may include a hall effect IC and the GPIO to determine the opening/closing state of the cover. At this time, the electronic device determines the opening/closing state of the cover. However, since it is not determined how the electronic device is mounted on the cover, it is difficult to provide a user-friendly environment in a mounted state.

According to various embodiments of the present disclosure, an electronic device may recognize the mounted state of a cover and perform an operation according to the state of the cover.

In accordance with an aspect of the present disclosure, an electronic device from which an accessory including at least one magnet is removable may include a housing of the electronic device including a front housing capable of being covered by at least part of the accessory and a rear housing from which at least other part of the accessory is removable, a display exposed through at least part of the front housing, an electromagnetic induction panel disposed inside the housing, including a first channel group corresponding to a first direction and a second channel group corresponding to a second direction perpendicular to the first direction, and sensing a first signal flowing into the first channel group and a second signal flowing into the second channel group, and a processor disposed inside the housing and electrically connected to the electromagnetic induction panel. The processor may be configured, if a combination of at least one first channel, in which it is sensed that a magnitude of the first signal is not greater than a first critical value, in the first channel group and at least one second channel, in which it is sensed that a magnitude of the second signal is not greater than a second critical value, in the second channel group corresponds to one of predefined channel combinations, to perform a preset operation.

In accordance with an aspect of the present disclosure, a method of an electronic device is provided. The method includes sensing that a magnitude of a first signal is not greater than a first critical value, sensing that a magnitude of a second signal is not greater than a second critical value, and if a combination of at least one first channel in a first channel group of an electromagnetic induction panel and at least one second channel in a second channel group of the electromagnetic induction panel corresponds to one of predefined channel combinations, performing a preset operation.

In accordance with an aspect of the present disclosure, an electronic device from which an accessory including at least one magnet is removable may include a housing of the electronic device including a front housing covered by the accessory, a display exposed through at least part of the front housing, an electromagnetic induction panel disposed inside the housing, including a first channel group corresponding to a first direction and a second channel group corresponding to a second direction perpendicular to the first direction, and sensing a first signal flowing into the first channel group and a second signal flowing into the second channel group, and a processor disposed inside the housing and electrically connected to the electromagnetic induction panel. The processor may be configured, if a combination of at least one first channel, in which it is sensed that a magnitude of the first signal is not greater than a first critical value, in the first channel group and at least one second channel, in which it is sensed that a magnitude of the second signal is not greater than a second critical value, in the second channel group corresponds to one of predefined channel combinations, to perform a preset operation.

In accordance with an aspect of the present disclosure, an electronic device coupled to an accessory may include the accessory covering at least part of a housing of the electronic device and including at least one magnet, the housing of the electronic device including a front housing, a display exposed through at least part of the front housing, an electromagnetic induction panel disposed inside the housing, including a first channel group corresponding to a first direction and a second channel group corresponding to a second direction perpendicular to the first direction, wherein a magnitude of a first signal flowing into the first channel group and a magnitude of a second signal flowing into the second channel group are reduced due to a magnetic field applied by the magnet, and a processor disposed inside the housing and electrically connected to the electromagnetic induction panel. The processor may be configured, if a combination of at least one first channel, in which a magnitude of the first signal is not greater than a first critical value, in the first channel group and at least one second channel, in which a magnitude of the second signal is not greater than a second critical value, in the second channel group corresponds to one of predefined channel combinations, to perform a preset operation.

According to various embodiments disclosed in the present disclosure, an electronic device may recognize whether an accessory using a magnet is mounted, or the state of an accessory, by using an electromagnetic induction panel, thus providing a user with a convenient usage environment.

In addition, since an electronic device according to an embodiment of the present disclosure does not connect to an accessory electrically and does not use a hall effect IC, a cost to produce the electronic device may be saved.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

For a more complete understanding of the present disclosure and its advantages, reference is now made to the following description taken in conjunction with the accompanying drawings, in which like reference numerals represent like parts.

Throughout the drawings, it should be noted that like reference numbers are used to depict the same or similar elements, features, and structures.

DETAILED DESCRIPTION

Figure 1:
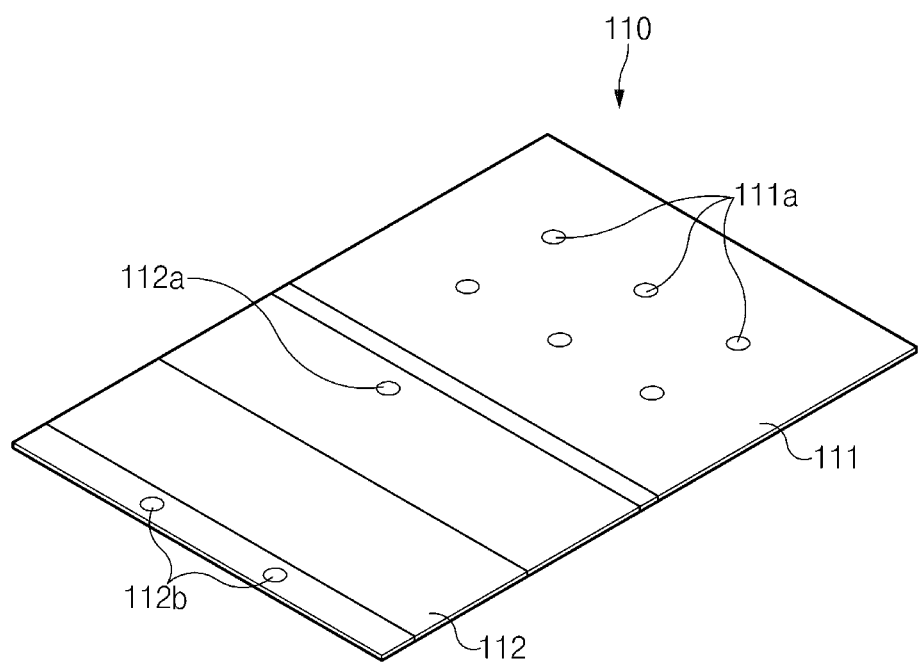
FIG. 1 illustrates a view of a cover, according to an embodiment of the present disclosure.

FIGS. 1 through 16, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Various embodiments of the present disclosure may be described with reference to accompanying drawings. Embodiments and terms used herein are not intended to limit the technologies described in the present disclosure to specific embodiments, and it should be understood that the embodiments and the terms include modification, equivalent, and/or alternative on the corresponding embodiments described herein. With regard to description of drawings, similar elements may be marked by similar reference numerals. The terms of a singular form may include plural forms unless otherwise specified. In the disclosure disclosed herein, the expressions "A or B", "at least one of A or/and B", and the like used herein may include any and all combinations of one or more of the associated listed items. Expressions such as "first," or "second," and the like, may express their elements regardless of their priority or importance and may be used to distinguish one element from another element but is not limited to these components. When an (e.g., first) element is referred to as being "(operatively or communicatively) coupled with/to" or "connected to" another (e.g., second) element, it may be directly coupled with/to or connected to the other element or an intervening element (e.g., a third element) may be present.

According to the situation, the expression "configured to" used herein may be interchangeably used as, for example, the expression "suitable for", "having the capacity to", "designed to", "adapted to", "made to", or "capable of". The expression "a device configured to" may mean that the device is "capable of" operating together with another device or other components. For example, a "processor configured to (or set to) perform A, B, and C" may mean a dedicated processor (e.g., an embedded processor) for performing a corresponding operation or a generic-purpose processor (e.g., a central processing unit (CPU) or an application processor) which performs corresponding operations by executing one or more software programs which are stored in a memory device.

According to various embodiments, an electronic device may be a flexible electronic device or may be a combination of two or more of the above-described devices. An electronic device according to an embodiment of the present disclosure may not be limited to the above-described electronic devices. The term "user" used herein may refer to a person who uses an electronic device or may refer to a device (e.g., an artificial intelligence electronic device) that uses an electronic device.

FIG. 1 illustrates a view of a cover, according to an embodiment of the present disclosure.

Referring to FIG. 1, a cover 110 according to an embodiment of the present disclosure may include at least one magnet 111a, 112a, or 112b, and may include a back cover 111 and a front cover 112.

The back cover 111 may be removable from the rear housing of an electronic device and may include the at least one magnet 111a. The back cover 111 may be attached to the rear housing by the magnetic force of the magnet 111a.

The front cover 112 may cover the front housing of the electronic device and may include the at least one magnet 112a or 112b. As illustrated in FIG. 1, the front cover 112 may include the first magnet 112a and the second magnet 112b.

Figure 7A:
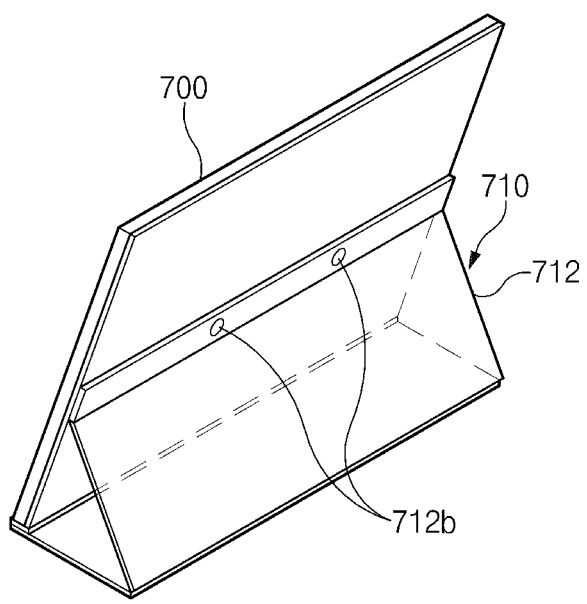
FIG. 7A illustrates a view of how a part of a cover mounts an electronic device while being attached to a rear surface of an electronic device, according to an embodiment of the present disclosure.
Figure 8A:
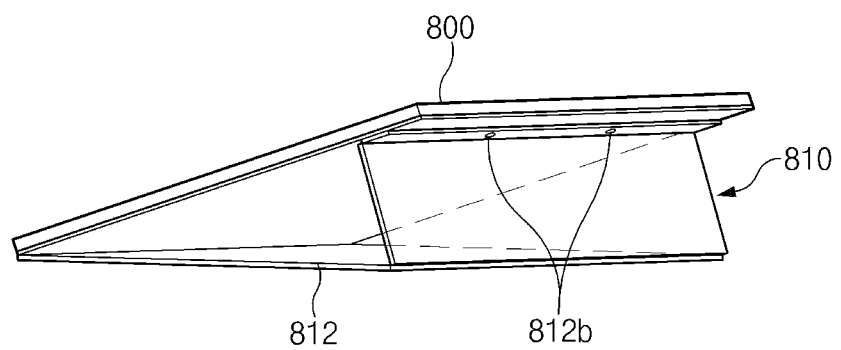
FIG. 8A illustrates a view of how a part of a cover mounts an electronic device while being attached to a rear surface of an electronic device, according to another embodiment of the present disclosure.

The first magnet 112a may be used to recognize the opening/closing of the front cover 112. In addition, the second magnet 112b may attach the front cover 112 to the front housing and may be used to mount the electronic device that is coupled to the cover 110. For example, the front cover 112 is bended at at least one point and a part of the front cover 112 is attached to the back cover 111 by the magnetic force of the second magnet 112b, and then, as illustrated in FIGS. 7A and 8A, the front cover 112 may mount the electronic device.

Figure 2:
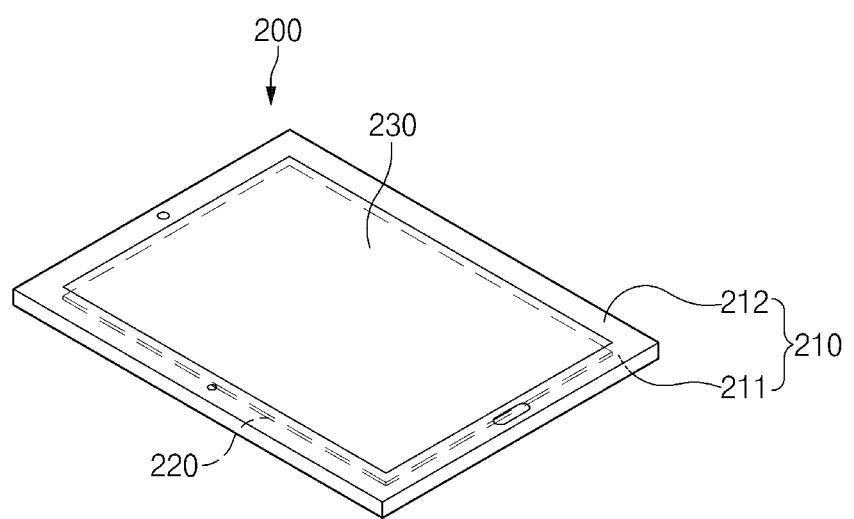
FIG. 2 illustrates a view of an outer appearance of an electronic device, according to an embodiment of the present disclosure.

FIG. 2 illustrates a view of an outer appearance of an electronic device, according to an embodiment of the present disclosure.

Referring to FIG. 2, an electronic device 200 according to an embodiment may include a housing 210, an electromagnetic induction panel 220, a display 230, a processor (not illustrated), and the like.

The housing 210 may include a rear housing 211 and a front housing 212. A back cover such as the back cover as illustrated in FIG. 1 may be attached to the rear housing 211, and the front housing 212 may be covered by the front cover such as the front cover as illustrated in FIG. 1.

The electromagnetic induction panel 220 may not be exposed in the outer appearance of the electronic device 200. However, the electromagnetic induction panel 220 may be disposed inside the housing 210 and may be disposed parallel to the display 230.

The display 230 may be exposed through at least part of the front housing 212.

The processor may not be exposed in the outer appearance of the electronic device 200. However, the processor may be electrically connected to the electromagnetic induction panel 220 and the display 230 and may be disposed inside the housing 210.

Hereinafter, a configuration in which an electronic device 300 according to an embodiment of the present disclosure is included will be described with reference to FIGS. 3A and 3B.

Figure 3A:
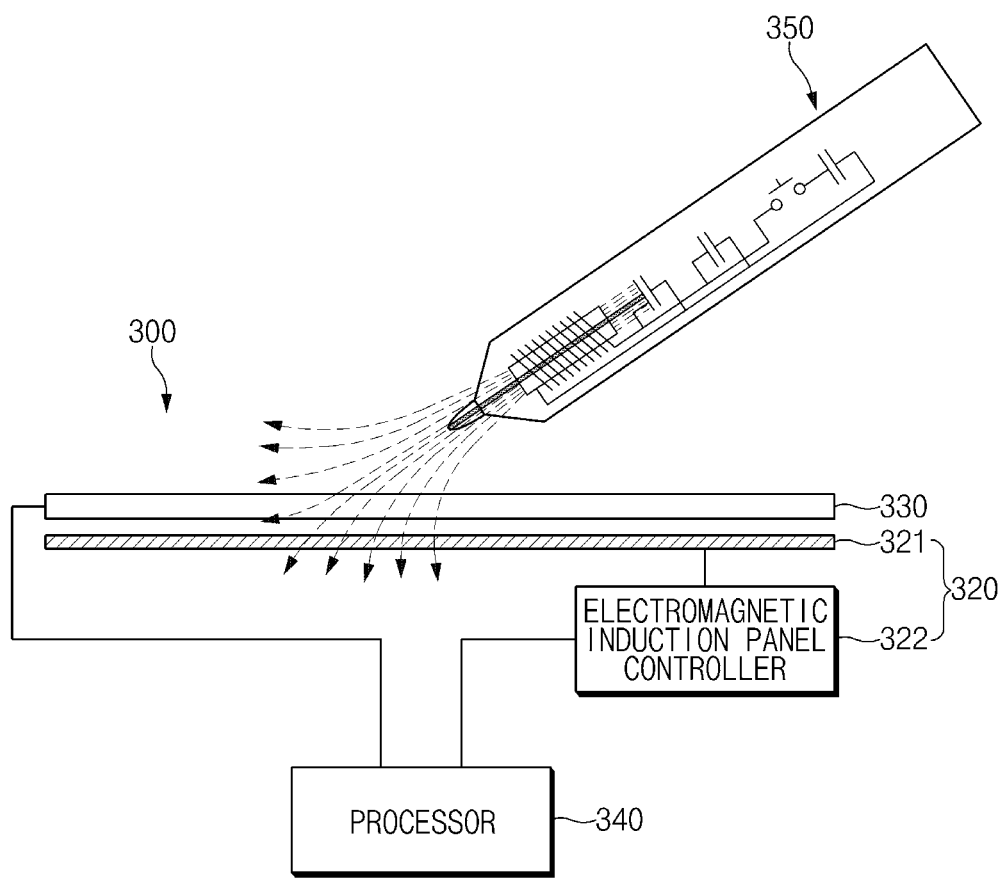
FIG. 3A illustrates a view of an electronic device to which a magnetic field of a pen input device is applied, according to an embodiment of the present disclosure.

FIG. 3A illustrates a view of an electronic device to which a magnetic field of a pen input device is applied, according to an embodiment of the present disclosure. FIG. 3B illustrates a view of a circuit diagram of an electromagnetic induction panel, according to an embodiment of the present disclosure.

Referring to FIG. 3A, the electronic device 300 according to various embodiments of the present disclosure may include an electromagnetic induction panel 320, a display 330, a processor 340, and the like. An electromagnetic induction panel pad 321 and the display 330 may be stacked. The electromagnetic induction panel 320 and the display 330 may correspond to the electromagnetic induction panel 220 and the display 230 of FIG. 2, respectively.

The electromagnetic induction panel 320 may include the electromagnetic induction panel pad 321 and an electromagnetic induction panel controller 322.

Figure 3B:
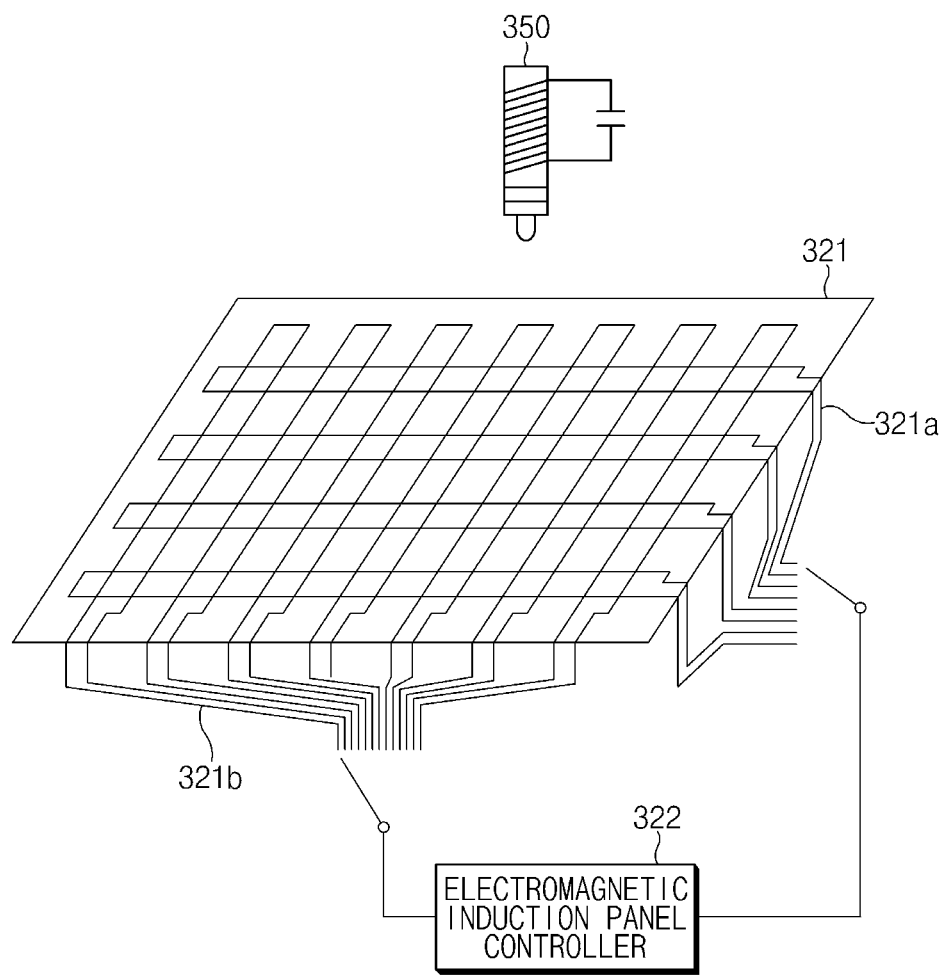
FIG. 3B illustrates a view of a circuit diagram of an electromagnetic induction panel, according to an embodiment of the present disclosure.

Referring to FIG. 3B, the electromagnetic induction panel pad 321 may include a plurality of loop antenna coils overlapped with each other in a first direction (e.g., a landscape mode) and in a second direction (e.g., a portrait mode) perpendicular to the first direction and may generate an electromagnetic field. One antenna coil may constitute one channel, or a plurality of antenna coils may constitute one channel. That is, the electromagnetic induction panel pad 321 may include a first channel group 321a corresponding to the first direction and a second channel group 321b corresponding to the second direction perpendicular to the first direction. In addition, the electromagnetic induction panel pad 321 may include a shield plate (not illustrated) for shielding a noise, on one surface.

The electromagnetic induction panel controller 322 may sense a signal that flows into the first channel group 321a and the second channel group 321b to detect the location of a pen input device 350; the electromagnetic induction panel controller 322 may provide the processor 340 with the detection location as coordinates at which the pen input device 350 is recognized.

If the pen input device 350 contacts or approaches the electromagnetic field of the electromagnetic induction panel pad 321, a resonance circuit unit of the pen input device 350 may generate a current, and then a magnetic field may be formed by the current. The magnitude of a signal that flows into at least one first channel of the first channel group 321a and at least one second channel of the second channel group 321b may be changed by the formed magnetic field. The electromagnetic induction panel controller 322 may detect a location, at which the first channel and the second channel, in each of which the magnitude of the signal is changed, intersect each other, as the location of the pen input device 350. For example, if the pen input device 350 approaches the electromagnetic induction panel pad 321, the magnitude of the signal flowing into the first channel and the second channel corresponding to a location that the pen input device 350 approaches may increase.

Meanwhile, the magnitude of the signal flowing into the first channel group 321a and the second channel group 321b of the electromagnetic induction panel pad 321 may decrease by applying a magnetic field of a magnet. As in the detection of the location of the pen input device 350, the electromagnetic induction panel controller 322 may sense the magnitude of the signal flowing into the first channel group 321a and the second channel group 321b and may detect the location of a magnet that contacts or approaches the electromagnetic field of the electromagnetic induction panel pad 321. For example, if the magnet approaches the electromagnetic induction panel pad 321, the magnitude of the signal flowing into the first channel and the second channel corresponding to a location that the magnet approaches may decrease.

The display 330 may output a screen generated by the processor 340.

If a combination of at least one first channel, in which it is sensed that the magnitude of the signal is not greater than a first critical value, in the first channel group 321a and at least one second channel, in which it is sensed that the magnitude of the signal is not greater than a second critical value, in the second channel group 321b corresponds to one of predefined channel combinations, the processor 340 may be configured to perform a preset operation. The operation performed by the processor 340 may include an operation of changing a screen displayed in the display 330, an operation of sensing that an accessory is attached to the electronic device 300, an operation of adjusting power consumed by the processor, or the like.

Furthermore, the processor 340 may be configured to sense a type of the attached accessory based on a combination of the first channel and at least one second channel.

The processor 340 may be configured to apply a correction value to a location of the pen input device 350, which is sensed by the electromagnetic induction panel 320, based on the combination of the first channel and at least one second channel.

Figure 3C:
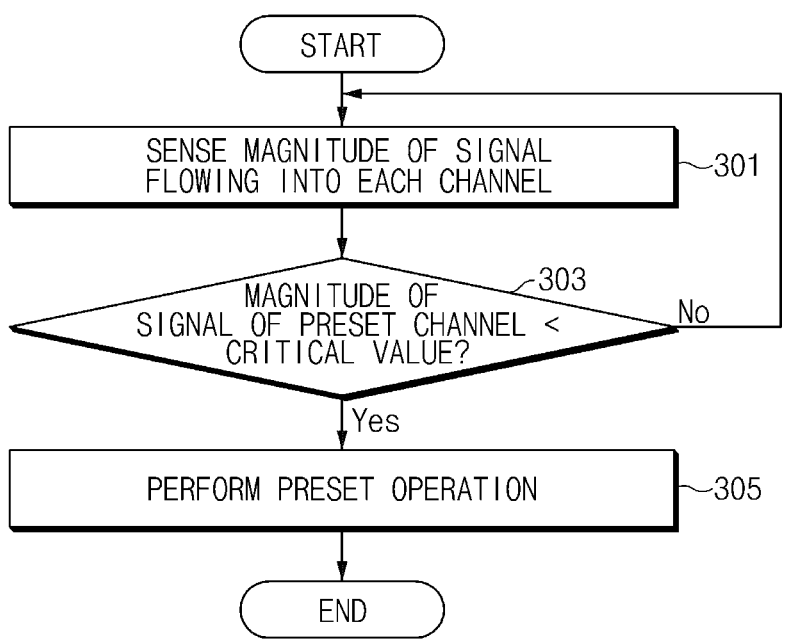
FIG. 3C illustrates a flowchart of a method in which a processor performs a preset operation, according to an embodiment of the present disclosure.

FIG. 3C illustrates a flowchart of a method in which a processor performs a preset operation, according to an embodiment of the present disclosure.

In operation 301, an electromagnetic induction panel senses the magnitude of a signal flowing into a first channel group and a second channel group. The electromagnetic induction panel may sense the magnitude of a signal flowing into each of channels included in the first channel group and the second channel group.

In operation 303, the processor may determine whether the magnitude of a signal flowing into a preset channel is less than a critical value. In an embodiment, the preset channel may be a combination of a channel included in the first channel group and a channel included in the second channel group. The critical value may include a plurality of values.

In the case where the magnitude of the signal flowing into the preset channel is less than a critical value, in operation 305, the processor may perform a preset operation. In an embodiment, the processor may perform an operation based on the combination of channels into which the signal, the magnitude of which is not greater than the critical value, flows.

Hereinafter, the detailed operation of the processor for each state of an accessory will be described with reference to FIGS. 4A to 12B.

The operation of the processor in a state where the accessory is attached to a housing will be exemplified with reference to FIGS. 4A to 5B.

In the specification, it is assumed that the accessory to be mounted in the electronic device is a cover. However, the accessory to which the present disclosure is capable of being applied is not limited to a cover.

Figure 4A:
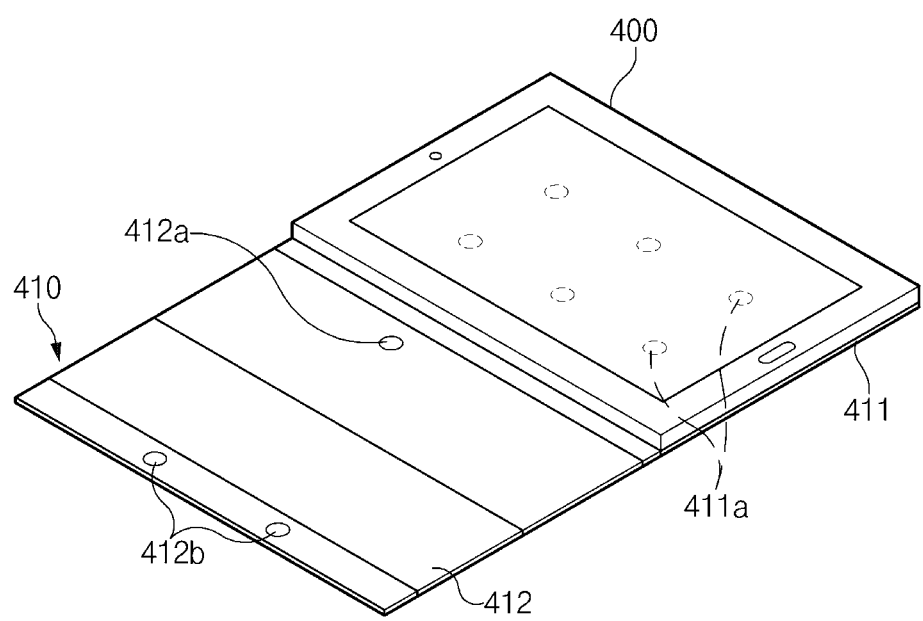
FIG. 4A illustrates a view of how a cover is attached to an electronic device, according to an embodiment of the present disclosure.
Figure 4B:
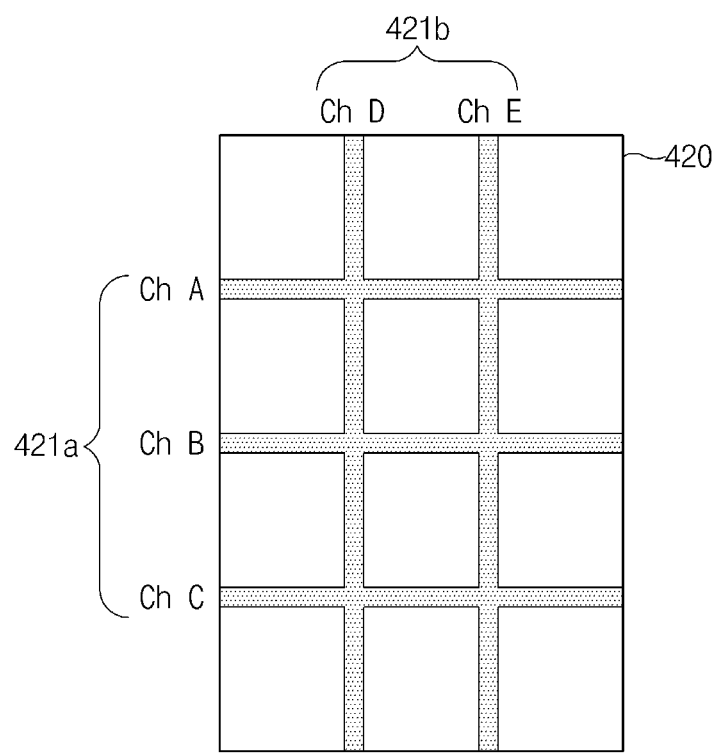
FIG. 4B illustrates a view of a channel in which it is sensed, by an electromagnetic induction panel of an electronic device illustrated in FIG. 4A, that a magnitude of a signal is not greater than a critical value, according to an embodiment of the present disclosure.

FIG. 4A illustrates a view of how a cover is attached to an electronic device 400, according to an embodiment of the present disclosure. FIG. 4B illustrates a view of a channel in which it is sensed, by an electromagnetic induction panel of the electronic device 400 illustrated in FIG. 4A, that a magnitude of a signal is not greater than a critical value, according to an embodiment of the present disclosure.

In this embodiment, it is assumed that a predefined channel combination allowing a processor to sense that a cover is attached to an electronic device 400 includes a combination of channels A, B, and C 421a as a first channel and channels D and E 421b as a second channel.

As illustrated in FIG. 4A, if a back cover 411 is attached to the rear housing of the electronic device 400, a plurality of magnets 411a included in the back cover 411 may apply a magnetic field to a cover 410. As such, the magnitude of a signal flowing into the first channel and the second channel corresponding to locations of the plurality of magnets 411a may decrease.

According to an embodiment of the present disclosure, as illustrated in FIG. 4B, it may be sensed that the magnitude of a signal of each of the channels A, B, and C 421a in the first channel group is not greater than a first critical value, by using to the magnets 411a of the back cover 411; it may be sensed that the magnitude of a signal of each of the channels D and E 421b in the second channel group is not greater than a second critical value, by using the magnets 411a of the back cover 411. That is, points at which channels A, B, and C are intersected with channels D and E may correspond to the locations of the magnets 411a of the back cover 411.

Since a combination of the channels A, B, and C 421a, in which it is sensed that the magnitude of the signal is not greater than the first critical value, and the channels D and E 421b, in which it is sensed that the magnitude of the signal is not greater than the second critical value is included in the above-described predefined channel combination, the processor may sense that the cover is attached to the electronic device 400.

Figure 5A:
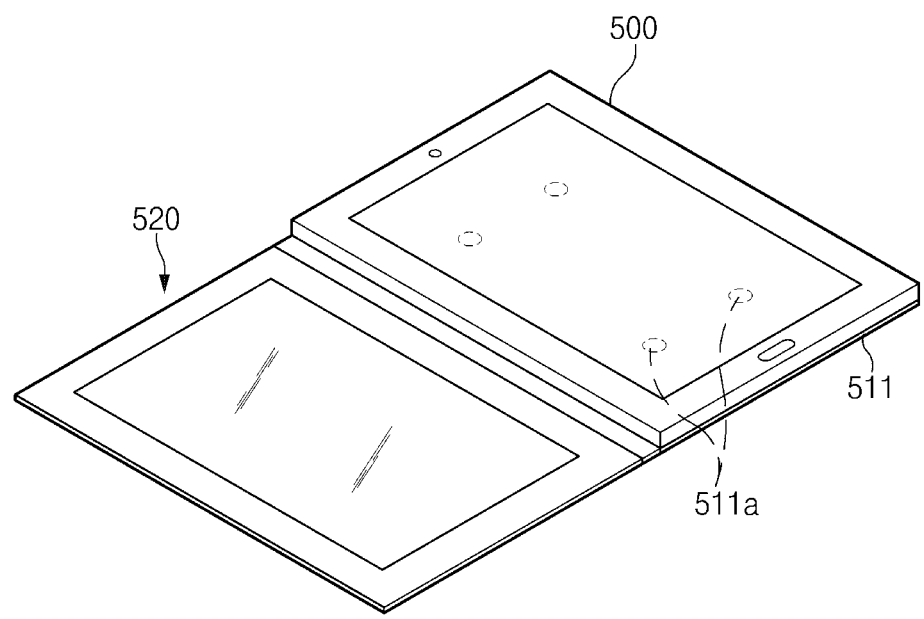
FIG. 5A illustrates a view of how a cover different from a cover of FIG. 4A is attached to an electronic device, according to an embodiment of the present disclosure.
Figure 5B:
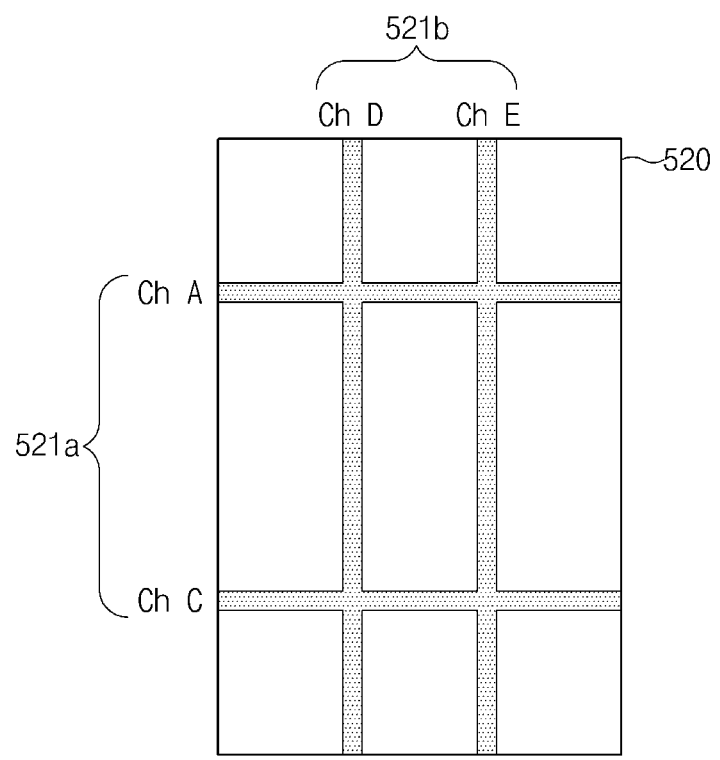
FIG. 5B illustrates a view of a channel in which it is sensed, by an electromagnetic induction panel of an electronic device illustrated in FIG. 5A, that a magnitude of a signal is not greater than a critical value, according to an embodiment of the present disclosure.

FIG. 5A illustrates a view of how a cover different from a cover of FIG. 4A is attached to an electronic device 500, according to an embodiment of the present disclosure. FIG. 5B illustrates a view of a channel in which it is sensed, by an electromagnetic induction panel of the electronic device 500 illustrated in FIG. 5A, that a magnitude of a signal is not greater than a critical value, according to an embodiment of the present disclosure.

In this embodiment, it is assumed that a predefined channel combination allowing a processor to sense that a cover is attached to the electronic device 500 includes a combination of channels A and C 521a as a first channel and channels D and E 521b as a second channel.

As in descriptions given with reference to FIGS. 4A and 4B, since a combination of the channels A and C, in which it is sensed that the magnitude of the signal is not greater than a first critical value, and channels D and E, in which it is sensed that the magnitude of the signal is not greater than a second critical value is included in the above-described predefined channel combination, the processor may sense that the cover is attached to the electronic device 500.

Meanwhile, a type of the cover 410 of FIG. 4 may be different from a type of a cover 510 of FIG. 5A, and the placement of magnets 411a or 511a included in the back cover 411 or 511 of the covers 410 or 510 may be different from each other. The processor may sense a type of the cover attached to a rear housing, based on a combination of the at least one first channel 421a or 521a, in which it is sensed that the magnitude of a signal is not greater than the first critical value, in the first channel group, and the at least one second channel 421b or 521b, in which it is sensed that the magnitude of a signal is not greater than the second critical value, in the second channel group.

For example, in the case where the first channel 421a or 521a in which it is sensed that the magnitude of a signal is not greater than the first critical value, is channels A, B, and C, and the second channel 421b or 521b in which it is sensed that the magnitude of a signal is not greater than the second critical value, is channels D and E, the processor may sense that the cover 410 of FIG. 4A is attached to the electronic device 400. In addition, in the case where the first channel in which it is sensed that the magnitude of a signal is not greater than the first critical value, is one of the channels A and C 521a, and the second channel in which it is sensed that the magnitude of a signal is not greater than the second critical value, is one of the channels D and E 521b, the processor may sense that the cover 510 of FIG. 5A is attached to the electronic device 500.

Figure 6A:
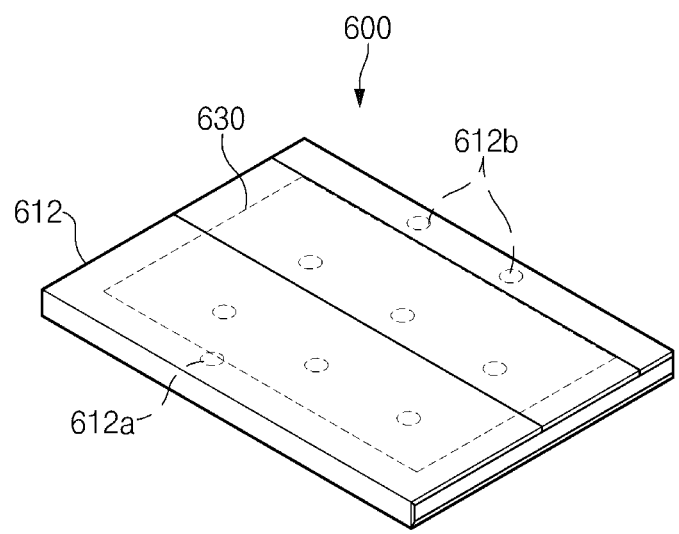
FIG. 6A illustrates a view of how a cover covers a front housing of an electronic device, according to an embodiment of the present disclosure.
Figure 6B:
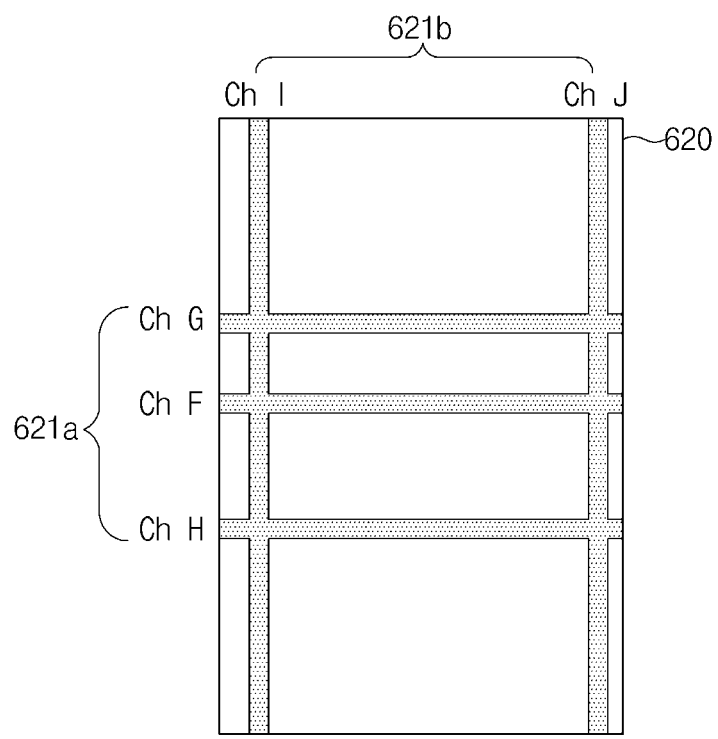
FIG. 6B illustrates a view of a channel in which it is sensed, by an electromagnetic induction panel of an electronic device illustrated in FIG. 6A, that a magnitude of a signal is not greater than a critical value, according to an embodiment of the present disclosure.

The operation of the processor in a state where a cover covers a front housing will be exemplified with reference to FIGS. 6A and 6B.

FIG. 6A illustrates a view of how a cover covers a front housing of an electronic device 600, according to an embodiment of the present disclosure. FIG. 6B illustrates a view of a channel in which it is sensed, by an electromagnetic induction panel of the electronic device 600 illustrated in FIG. 6A, that a magnitude of a signal is not greater than a critical value, according to an embodiment of the present disclosure.

In this embodiment, it is assumed that the predefined channel combination allowing a processor to turn off a display 630 includes a combination of channels F, G, and H 621a being a first channel and channels I and J 621b being a second channel.

As illustrated in FIG. 6A, if a front cover 612 covers the front housing of an electronic device 600, magnets 612a and 612b included in the front cover 612 may apply a magnetic field to a housing. As such, the magnitude of a signal flowing into the first channel and the second channel corresponding to the location of a magnet may decrease.

According to an embodiment of the present disclosure, as illustrated in FIG. 6B, it may be sensed that the magnitude of a signal of each of the channels F, G, and H 621a in the first channel group is not greater than the first critical value, by using the magnets 612a and 612b of the front cover 612; it may be sensed that the magnitude of a signal of each of channels I and J 621b in the second channel group is not greater than the second critical value, by using the magnets 612a and 612b of the front cover 612. That is, points at which channels F, G, and H are intersected with channels I and J may correspond to the locations of the magnets 612a and 612b of the front cover 612.

Since a combination of the channels F, G, and H 621a, in which it is sensed that the magnitude of the signal is not greater than the first critical value, and the channels I and J 621b, in which it is sensed that the magnitude of the signal is not greater than the second critical value, is included in the above-described predefined channel combination, the processor may turn off the display.

Figure 10A:
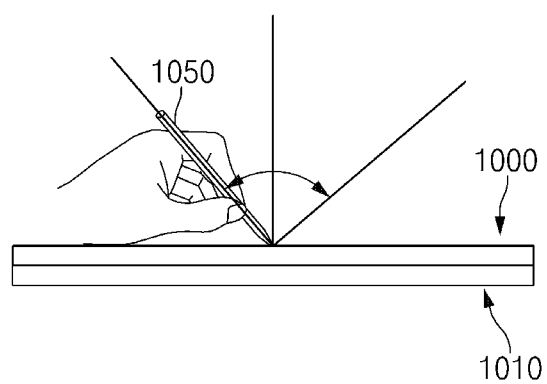
FIGS. 10A-10C illustrates views of ranges of an angle at which a pen input device is inclined depending on a state where an electronic device is mounted, according to an embodiment of the present disclosure.
Figure 10B:
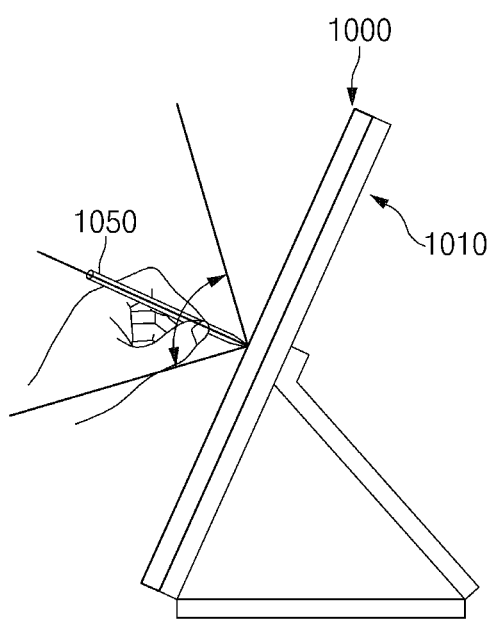
Figure 10C:
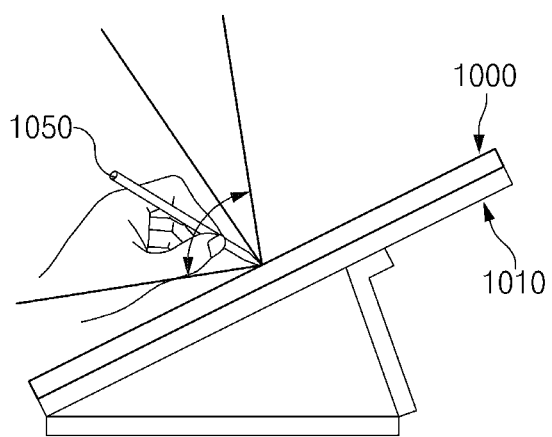

The operation of the processor in a state where a part of a cover 710, 810, or 1010 mounts the electronic device 700, 800, or 1000 while being attached to the rear surface of an electronic device 700, 800, or 1000 will be exemplified with reference to FIGS. 7A and 10C.

Figure 7B:
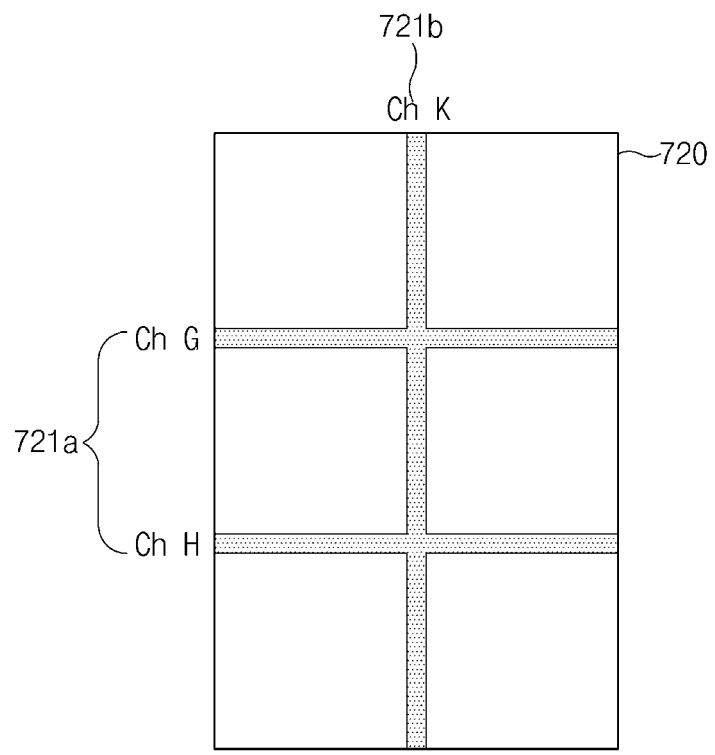
FIG. 7B illustrates a view of a channel in which it is sensed, by an electromagnetic induction panel of an electronic device illustrated in FIG. 7A, that a magnitude of a signal is not greater than a critical value, according to an embodiment of the present disclosure.
Figure 8B:
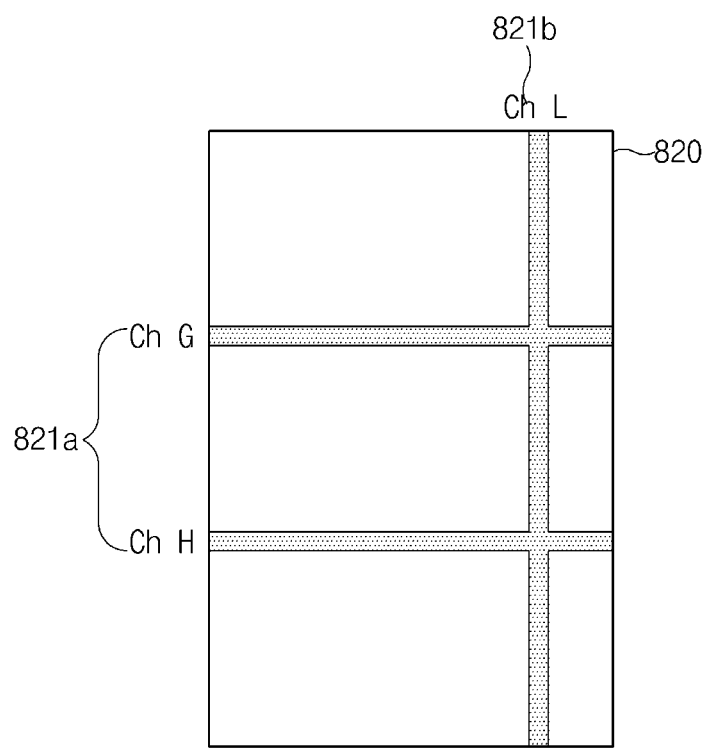
FIG. 8B illustrates a view of a channel in which it is sensed, by an electromagnetic induction panel of an electronic device illustrated in FIG. 8A, that a magnitude of a signal is not greater than a critical value, according to an embodiment of the present disclosure.

FIG. 7A illustrates a view of how a part of a cover mounts the electronic device 700 while being attached to a rear surface of the electronic device 700, according to an embodiment of the present disclosure. FIG. 7B illustrates a view of a channel in which it is sensed, by an electromagnetic induction panel of the electronic device 700 illustrated in FIG. 7A, that a magnitude of a signal is not greater than a critical value, according to an embodiment of the present disclosure. FIG. 8A illustrates a view of how a part of a cover mounts the electronic device 800 while being attached to a rear surface of the electronic device 800, according to another embodiment of the present disclosure. FIG. 8B illustrates a view of a channel in which it is sensed, by an electromagnetic induction panel of the electronic device 800 illustrated in FIG. 8A, that a magnitude of a signal is not greater than a critical value, according to an embodiment of the present disclosure.

Figure 9A:
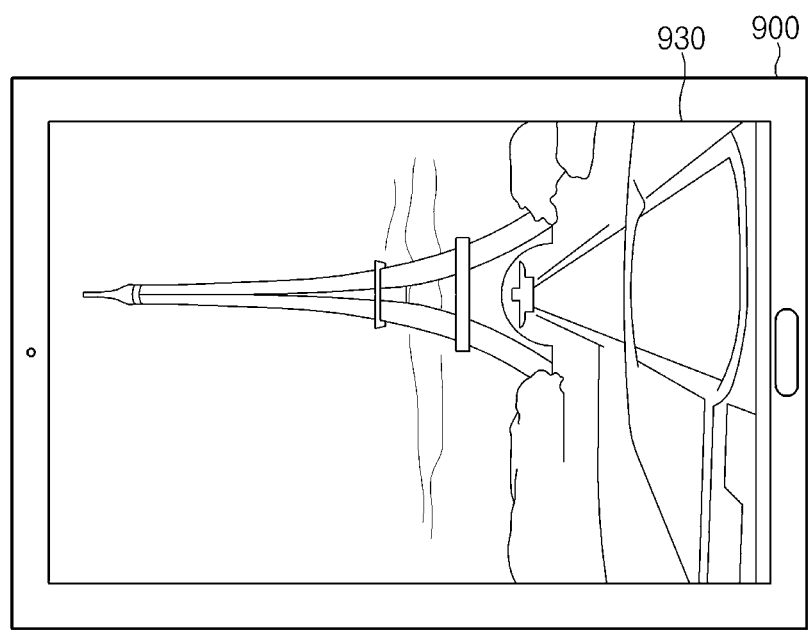
FIG. 9A illustrates a view of how a screen is displayed in a display of an electronic device in a portrait mode, according to an embodiment of the present disclosure.
Figure 9B:
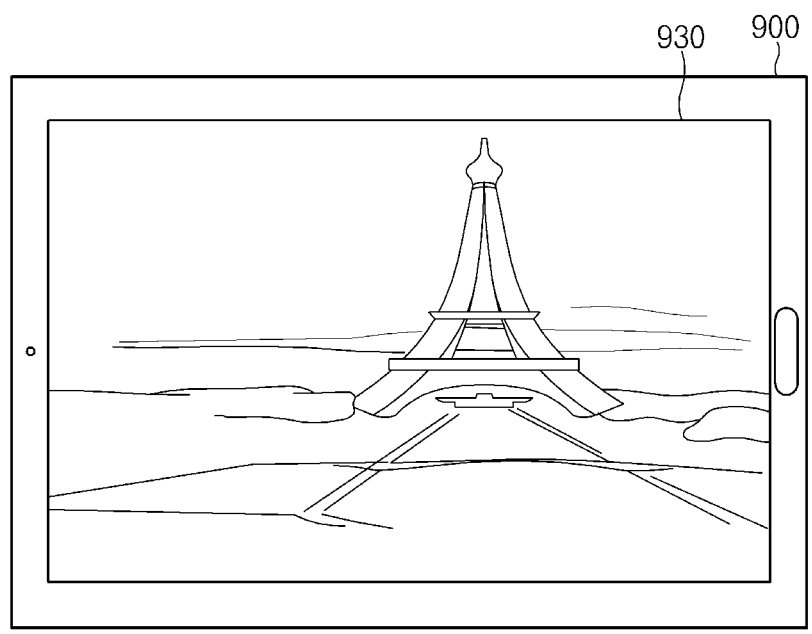
FIG. 9B illustrates a view of how a screen is displayed in a display of an electronic device in a landscape mode, according to an embodiment of the present disclosure.
Figure 9C:
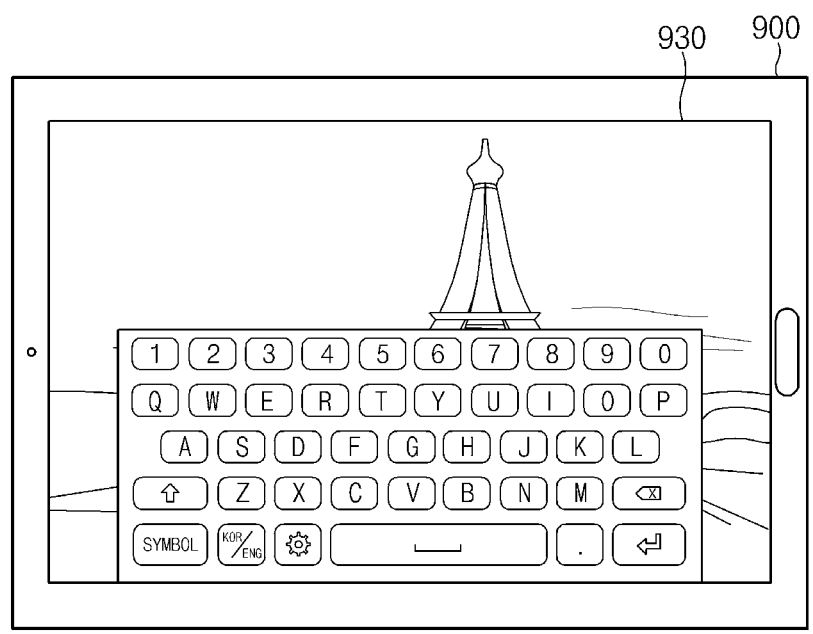
FIG. 9C illustrates a view of how a soft input panel is displayed in a display of an electronic device, according to an embodiment of the present disclosure.

FIG. 9A illustrates a view of how a screen is displayed in a display of an electronic device 900 in a portrait mode, according to an embodiment of the present disclosure. FIG. 9B illustrates a view of how a screen is displayed in a display of the electronic device 900 in a landscape mode, according to an embodiment of the present disclosure. FIG. 9C illustrates a view of how a soft input panel (SIP) is displayed in a display of the electronic device 900, according to an embodiment of the present disclosure.

FIGS. 10A to 10C are views illustrating ranges of an angle at which a pen input device is inclined depending on a state where an electronic device 1000 is mounted, according to an embodiment of the present disclosure.

In this embodiment, it is assumed that a predefined channel combination allowing a processor to display a screen displayed in a display, in a landscape mode includes a combination of channels G and H 721a being a first channel and channel K 721b being a second channel and a combination of channels G and H 821a being a first channel and channel L 821b being a second channel.

As illustrated in FIGS. 7A and 8A, if a part of the cover 710 or 810 is attached to the rear surface of the electronic device 700 or 800, magnets 712b or 812b included in a part of the cover 710 or 810 may apply a magnetic field to a housing. As such, the magnitude of a signal flowing into the first channel and the second channel corresponding to the location of the magnets 712b or 812b may decrease.

In an embodiment of FIG. 7A, as illustrated in FIG. 7B, it may be sensed that the magnitude of a signal of each of the channels G and H 721a in the first channel group, by using the magnets 712b of the front cover 710 is not greater than the first critical value; it may be sensed that the magnitude of a signal of the channel K 721b in the second channel group, by using the magnets 712b of the front cover 710 is not greater than the second critical value.

That is, points at which channels G and H are intersected with channel K may correspond to the locations of the magnets 712a of the front cover 710.

In an embodiment of FIG. 8A, as illustrated in FIG. 8B, it may be sensed that the magnitude of a signal of each of the channels G and H 821a in the first channel group is not greater than the first critical value, by using the magnets 812b of the front cover 810; it may be sensed that the magnitude of a signal of the channel L 821b in the second channel group is not greater than the second critical value, by using the magnets 812b of the front cover 810.

That is, points at which channels G and H are intersected with channel L may correspond to the locations of the magnets 812b of the front cover 810.

Since a combination of the channels G and H 721a, in which it is sensed that the magnitude of a signal is not greater than the first critical value, and the channel K 721b, in which it is sensed that the magnitude of a signal is not greater than the second critical value, and a combination of the channels G and H 821a, in which it is sensed that the magnitude of a signal is not greater than the first critical value, and the channel L 821b, in which it is sensed that the magnitude of a signal is not greater than the second critical value, are included in the above-described predefined channel combination, the processor may display a screen displayed in a display in a landscape mode.

For example, when the display, like a display 930 of FIG. 9A, of the electronic device 700 or 800 of FIG. 7A or 8A displays a screen in a portrait mode, if a channel combination corresponds to one of predefined channel combinations, the processor may display the screen in the landscape mode as illustrated the display 930 of FIG. 9B.

Referring to FIGS. 7A and 8A, an angle at which the cover 710 or 810 in each embodiment mounts the electronic device 700 or 800 may be different. For the purpose of displaying another user interface depending on a mounting angle, if the first channels in which it is sensed that the magnitude of a signal is not greater than the first critical value are the same as each other, and the second channels in which it is sensed that the magnitude of a signal is not greater than the second critical value are different from each other, the processor may display a different user interface in a display.

If FIG. 7B is compared with FIG. 8B, the first channel constituting a channel combination of FIG. 7B and a channel combination of FIG. 8B may be channels G and H 721a or 821a. However, the second channel constituting the channel combination of FIG. 7B may be the channel K 721b, and the second channel constituting the channel combination of FIG. 8B may be the channel L 821b.

In this embodiment, since the first channels constituting a channel combination of FIG. 7A and a channel combination of FIG. 8A are the same as each other, and the second channels are different from each other, the processor may display a different user interface in the display.

For example, in the case where a channel combination in which it is sensed that the magnitude of the signal is not greater than a critical value is the same as the channel combination of FIG. 7B, the processor may display a user interface as illustrated in the display of FIG. 9B. In the case where a channel combination in which it is sensed that the magnitude of the signal is not greater than the critical value is the same as the channel combination of FIG. 8B, the processor may display the SIP illustrated in FIG. 9C, unlike FIG. 9B. The SIP displayed in FIG. 9C may be a virtual keyboard. However, a user interface that the processor differently displays is not limited to this exemplification.

Meanwhile, referring to FIGS. 10A to 10C, the tilt angle range of a pen input device may be different depending on an angle at which the electronic device 1000 is mounted. Even though the end of a pen input device 1050 is located at the same point, the location of the pen input device 1050 that an electromagnetic induction panel detects may be changed depending on the tilt angle.

To correct the location of the pen input device 1050, which is sensed depending on a mounting angle, the processor may apply different correction values to the location of the pen input device 1050, which is sensed by the electromagnetic induction panel, based on a channel combination of at least one first channel and at least one second channel.

For example, in the case where the channel combination in which it is sensed that the magnitude of the signal is not greater than a critical value is the same as the channel combination of FIG. 7B, the processor may apply a predefined first correction value to the sensed location of the pen input device 1050. In the case where the channel combination in which it is sensed that the magnitude of the signal is not greater than a critical value is the same as the channel combination of FIG. 8B, the processor may apply a predefined second correction value to the sensed location of the pen input device 1050.

The operation of the processor that distinguishes a state where the front cover 612 covers a front housing from a state where a front cover 1112 is folded back to cover a rear housing will be exemplified with reference to FIGS. 6A, 6B, 11A, and 11B.

FIG. 6A illustrates a view of how the front cover 612 covers a front housing of the electronic device 600, according to an embodiment of the present disclosure. FIG. 6B illustrates a view of a channel in which it is sensed, by an electromagnetic induction panel 620 of an electronic device illustrated in FIG. 6A, that a magnitude of a signal is not greater than a critical value, according to an embodiment of the present disclosure.

Figure 11A:
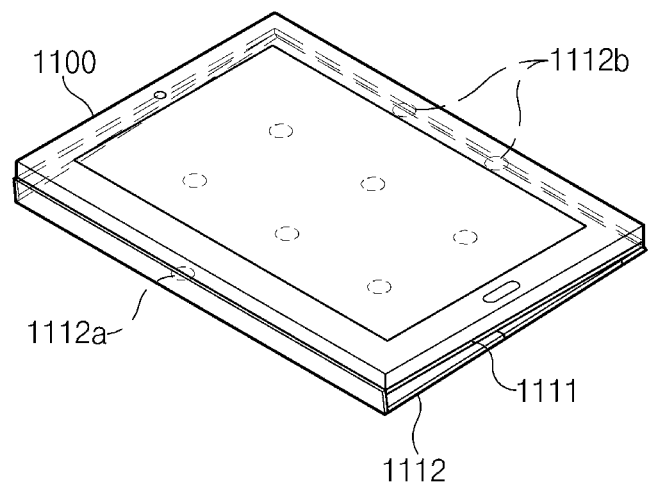
FIG. 11A illustrates a view of how a cover is folded to a rear surface of an electronic device, according to an embodiment of the present disclosure.
Figure 11B:
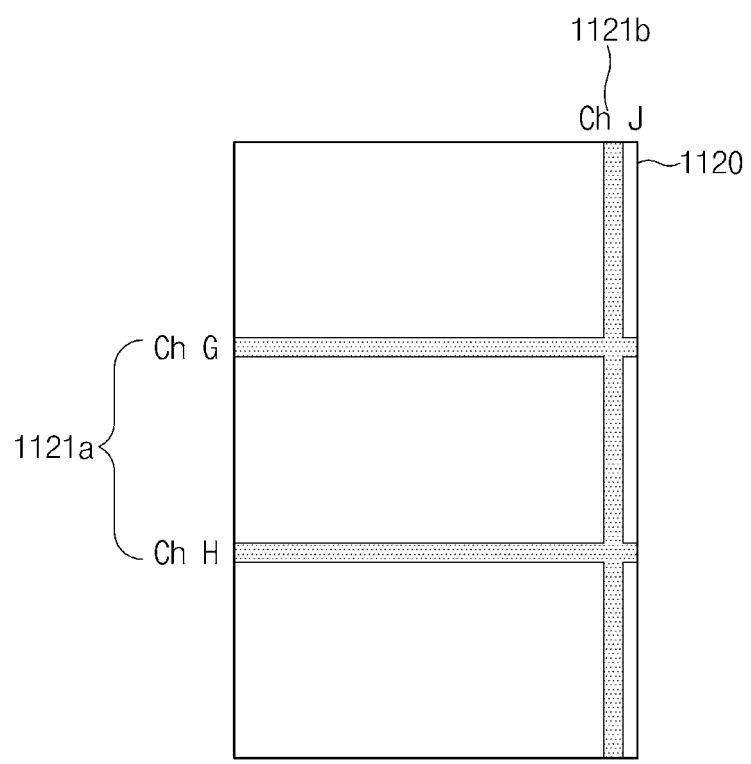
FIG. 11B illustrates a view of a channel in which it is sensed, by an electromagnetic induction panel of an electronic device illustrated in FIG. 11A, that a magnitude of a signal is not greater than a critical value, according to an embodiment of the present disclosure.

FIG. 11A illustrates a view of how the front cover 1112 is folded to a rear surface of an electronic device, according to an embodiment of the present disclosure. FIG. 11B illustrates a view of a channel in which it is sensed, by an electromagnetic induction panel including a shield plate in at least a portion of an electronic device illustrated in FIG. 11A, that a magnitude of a signal is not greater than a critical value, according to an embodiment of the present disclosure.

In this embodiment, it is assumed that the predefined channel combination allowing a processor to turn off a display includes a combination of channels F, G, and H 621a being the first channel and channels I and J 621b being the second channel.

As described above, if the front cover 612 covers the front housing of an electronic device as illustrated in FIG. 6A, the processor may turn off a display.

As illustrated in 11A, if the front cover 1112 is folded back to cover a rear housing 1111 of an electronic device 1100, a magnet 1112a and 1112b included in the front cover 1112 may apply a magnetic field to the rear housing 1111. As such, the magnitude of a signal flowing into a first channel and a second channel corresponding to locations of the magnet 1112a or 1112b may decrease.

As illustrated in FIG. 6B, it may be sensed that the magnitude of a signal of each of the channels F, G, and H 621a in the first channel group is not greater than the first critical value, by using the magnets 612a and 612b of the front cover 612; it may be sensed that the magnitude of a signal of each of the channels I and J 621b in the second channel group is not greater than the second critical value, by using the magnets 612a and 612b of the front cover 612.

In both the case where the front cover 1112 is folded back as illustrated in FIG. 11A and the case where the front cover 612 covers a front housing as illustrated in FIG. 6A, locations at which the magnets 1112a, 1112b, 612a, and 612b of the front cover 1112 or 612 applies a magnetic field to a housing may be almost the same. In both two cases, it may be sensed that the magnitude of a signal of each of channels F, G, and H in the first channel group is not greater than the first critical value, and it may be sensed that the magnitude of a signal of each of channels I and J in the second channel group is not greater than the second critical value. Accordingly, the processor may turn off the display.

As such, if the operation of a processor in the case where the front cover 612 covers the front housing is the same as the operation of the processor in the case where the front cover 1112 covers the rear housing 1111, a user may be inconvenient to use the electronic device. To determine whether the location of the magnet 612a, 612b, 1112a or 1112b applying the magnetic field is the front surface of the housing or the rear surface of the housing, the processor may be configured to perform the following operation.

In an embodiment, an electromagnetic induction panel may include a shield plate capable of shielding the magnetic field, on at least part of one surface. In the case where the shield plate is included in at least part of the rear surface of the electromagnetic induction panel, the intensity of the magnetic field applied to the electromagnetic induction panel through the rear housing may be smaller than the intensity of the magnetic field applied to the electromagnetic induction panel through the front housing. The processor may be configured to perform different operations based on at least one of the magnitude of a signal flowing into a first channel group and a second channel group of the electromagnetic induction panel or the combination of channels.

That is, if the magnitude of a signal flowing into at least one first channel in the first channel group and the magnitude of a signal flowing into at least one second channel in the second channel group satisfy a first range, the processor may be configured to perform a first operation. Moreover, if the magnitude of a signal flowing into the at least first channel in the first channel group and the magnitude of a signal flowing into the at least second channel in the first channel group satisfy a second range, the processor may be configured to perform a second operation distinguished from the first operation.

For example, as illustrated in FIG. 6A, if the magnitude of a signal flowing into the at least one first channel and the magnitude of a signal flowing into the at least one second channel satisfy the first range, the processor may turn off the display. Furthermore, as illustrated in FIG. 11A, if the magnitude of a signal flowing into the at least one first channel and the magnitude of a signal flowing into the at least one second channel satisfy the second range, the processor may perform an operation (e.g., maximally setting the brightness of the display) distinguished from an operation of turning off the display.

In another embodiment, it is assumed that the predefined channel combination allowing the processor to perform the first operation includes a combination of channels F, G, and H 621a being the first channel and channels I and J 621b being the second channel. It is assumed that the predefined channel combination allowing the processor to perform the second operation distinguished from the first operation includes a combination of channels G and H 1121a being the first channel and channel J 1121b being the second channel.

Since the shield plate is included in a part of the rear surface of an electromagnetic induction panel 1120, the magnetic field by the first magnet 1112a is shielded. Accordingly, the magnetic field by the first magnet 1112a may not be applied to the electromagnetic induction panel, and the magnetic field by the second magnet 1112b may be applied to the electromagnetic induction panel. As such, the magnitude of a signal flowing into the first channel 1121a and the second channel 1121b of FIG. 11B corresponding to locations of the magnet 1112a or 1112b may decrease.

As illustrated in FIG. 11B, it may be sensed that the magnitude of a signal flowing into the channels G and H 1121a in the first channel group is not greater than the first critical value, by using the magnets 1112a of the front cover 1112; it may be sensed that the magnitude of a signal flowing into the channel J 1121b in the second channel group is not greater than the second critical value, by using the magnets 1112a of the front cover 1112. That is, points at which channels G and H are intersected with channel L may correspond to the locations of magnets of the front cover 1112.

Since the combination of channels G and H, in which it is sensed that the magnitude of the signal is not greater than the first critical value, and channel J, in which it is sensed that the magnitude of the signal is not greater than the second critical value is included in a channel combination allowing the processor to perform the second operation, the processor may perform the second operation distinguished from the first operation.

As described above, if the magnitude of a signal flowing into at least one first channel and the magnitude of a signal flowing into at least one second channel satisfy a first range, the processor may be configured to perform a first operation. Moreover, if the magnitude of a signal flowing into the first channel and the magnitude of a signal flowing into the second channel satisfy a second range, the processor may be configured to perform a second operation distinguished from the first operation. An embodiment thereof will be described with reference to FIGS. 12A and 12B.

Figure 12A:
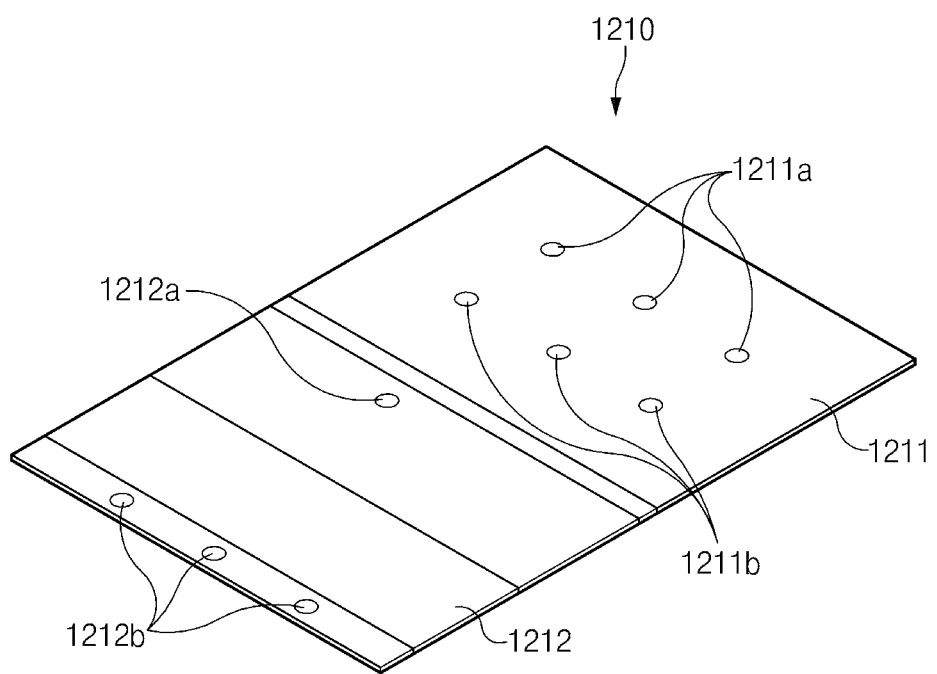
FIG. 12A illustrates a view of a cover, according to an embodiment of the present disclosure.

FIG. 12A illustrates a view of a cover, according to an embodiment of the present disclosure.

Figure 12B:
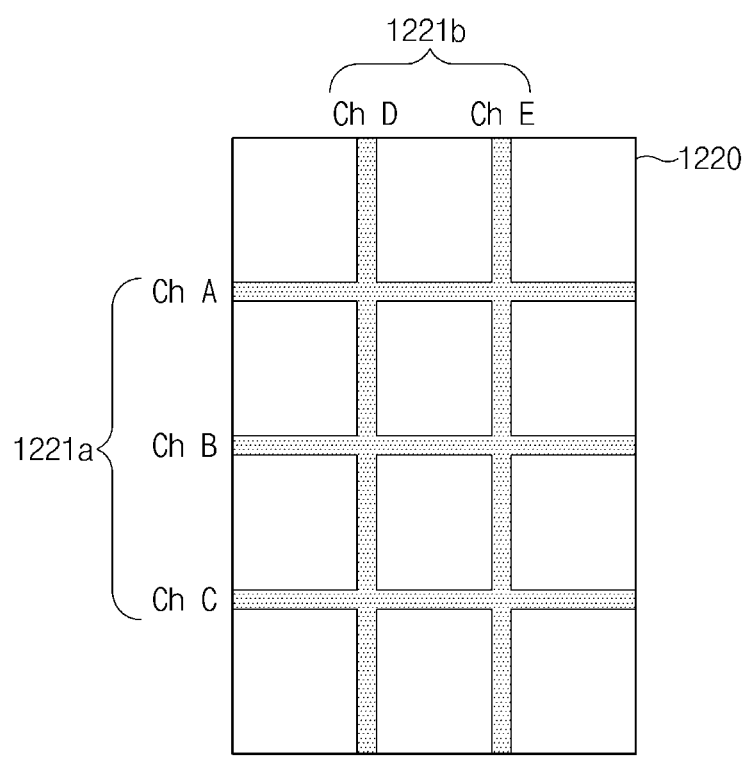
FIG. 12B illustrates a view of a channel in which it is sensed, by an electromagnetic induction panel of an electronic device in which a cover of FIG. 4A is mounted, that a magnitude of a signal is not greater than a critical value, according to an embodiment of the present disclosure.

FIG. 12B illustrates a view of a channel in which it is sensed, by an electromagnetic induction panel of an electronic device in which a cover of FIG. 4A is mounted, that a magnitude of a signal is not greater than a critical value, according to an embodiment of the present disclosure.

In this embodiment, in the case where the first channel in which it is sensed that the magnitude of a signal is not greater than the first critical value, is one of channels A, B, and C 1221a, and the second channel in which it is sensed that the magnitude of a signal is not greater than the second critical value, is one of channels D and E 1221b, the processor may sense that a cover 1210 of FIG. 12A is attached to the electronic device. A first range in which the processor performs the first operation may be defined as a range in which the magnitude of a signal flowing into the channels A, B, and C 1221a is not greater than a third critical value less than the first critical value and the magnitude of a signal flowing into the channel D 1221*b* is not greater than a fourth critical value less than the second critical value. A second range in which the processor performs the second operation may be defined as a range in which the magnitude of a signal flowing into the channels A, B, and C 1221*a* is not greater than the third critical value less than the first critical value and the magnitude of a signal flowing into the channel E 1221*b* is not greater than the fourth critical value less than the second critical value.

In an embodiment, as illustrated in FIG. 7A or 8A, when the cover of FIG. 12A mounts the electronic device, a second magnet 1212*b* of a front cover 1212 may be located at a point corresponding to a magnet 1211*a* or 1211*b* of a back cover 1211. For example, as illustrated in FIG. 7A, in the case where the electronic device is mounted, the second magnet 1212*b* of the front cover 1212 in FIG. 12A may be magnetically coupled to the second magnet 1211*b* of the back cover 1211. For another example, in the case where the electronic device is mounted as illustrated in FIG. 8A, the second magnet 1212*b* of the front cover 1212 in FIG. 12A may be magnetically coupled to the first magnet 1211*a* of the back cover 1211.

In both the case where the second magnet 1212*b* is magnetically coupled to the second magnet 1211*b* of the back cover 1211 and the case where the second magnet 1212*b* is magnetically coupled to the first magnet 1211*a* of the back cover 1211, the magnets 1211*a*, 1211*b*, and 1212*b* may apply a magnetic field to the same location of the electromagnetic induction panel. That is, since the second magnet 1212*b* at the same location as the location of the magnet 1211*a* or 1211*b* of the back cover 1211 applies the magnetic field to the rear housing, the first channel, in which it is sensed that the magnitude of a signal is not greater than a first critical value may be the channels A, B, and C 1221*a*, and the second channel, in which it is sensed that the magnitude of the signal is not greater than a second critical value may be the channels D and E 1221*b*.

However, since a magnetic field by the second magnet 1212*b* is further applied to the electromagnetic induction panel, the intensity of the magnetic field applied to the electromagnetic induction panel may be greater than the intensity of the magnetic field by the magnet 1211*a* or 1211*b* of the back cover 1211.

Accordingly, in the case where the second magnet 1212*b* is magnetically coupled to the second magnet 1211*b* of the back cover 1211, it may be sensed that the magnitude of a signal flowing into the channels A, B, and C 1221*a* in the first channel group is not greater than the third critical value less than the first critical value, and it may be sensed that the magnitude of a signal flowing into in channel D 1221*b* in the second channel group is not greater than the fourth critical value less than the second critical value. Since the magnitude of a signal flowing into a first channel and the magnitude of a signal of at least one second channel satisfy a first range, the processor may perform a first operation.

In the case where the second magnet 1212*b* is magnetically coupled to the first magnet 1211*a* of the back cover 1211, it may be sensed that the magnitude of a signal flowing into the channels A, B, and C 1221*a* in the first channel group is not greater than the third critical value less than the first critical value, and it may be sensed that the magnitude of a signal flowing into the channel E 1221*b* in the second channel group is not greater than the fourth critical value less than the second critical value. Since the magnitude of a signal flowing into the first channel and the magnitude of a signal flowing into at least one second channel satisfy a second range, the processor may perform a second operation.

As such, even though combinations of channels in which it is sensed that the magnitude of a signal is not greater than a critical value are the same as each other, the processor may perform an operation that is distinguished based on the magnitude of a signal flowing into each of the channels.

Figure 13A:
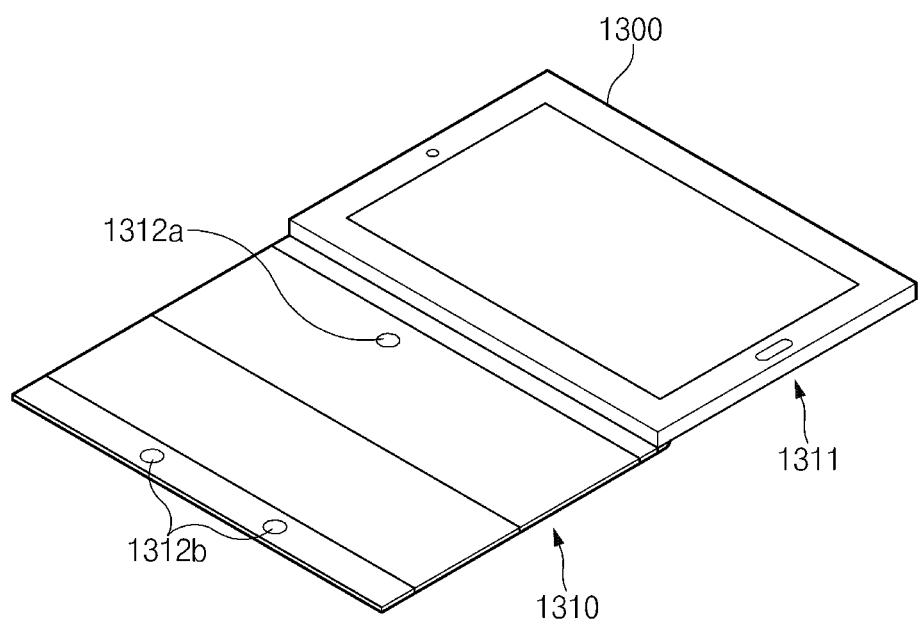
FIG. 13A illustrates a view of how a cover is coupled to an electronic device, according to another embodiment of the present disclosure.
Figure 13B:
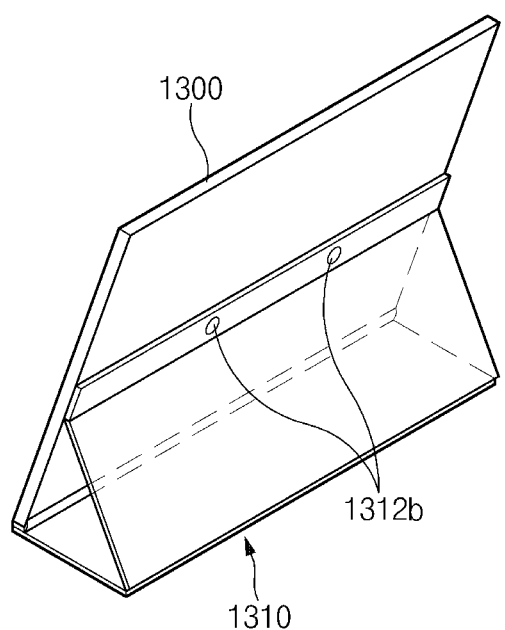
FIG. 13B illustrates a view of how a cover mounts an electronic device, according to FIG. 13A.

FIG. 13A illustrates a view of how a cover is coupled to an electronic device, according to another embodiment of the present disclosure. FIG. 13B illustrates a view of how a cover mounts an electronic device, according to FIG. 13A.

A cover 1310 illustrated in FIG. 13A may include at least one magnet 1312*a* or 1312*b* and, unlike the cover 110 illustrated in FIG. 1, may be attached to a part of a rear housing 1311 of an electronic device 1300. That is, the cover 1310 of FIG. 13A may be a shape corresponding to the front cover 112 of FIG. 1.

As illustrated in FIG. 13B, a part of the cover 1310 illustrated in FIG. 13A may be attached to the rear housing 1311 to mount the electronic device 1300. In addition, although not illustrated, as illustrated in FIG. 5A, the cover 1310 may cover the front housing of the electronic device 1300.

Furthermore, even in the case where the cover 1310 of FIG. 13A is attached to the electronic device 1300, as described above, the processor may change a screen displayed in a display, based on the magnitude of a signal flowing into a first channel group and a second channel group.

Figure 14:
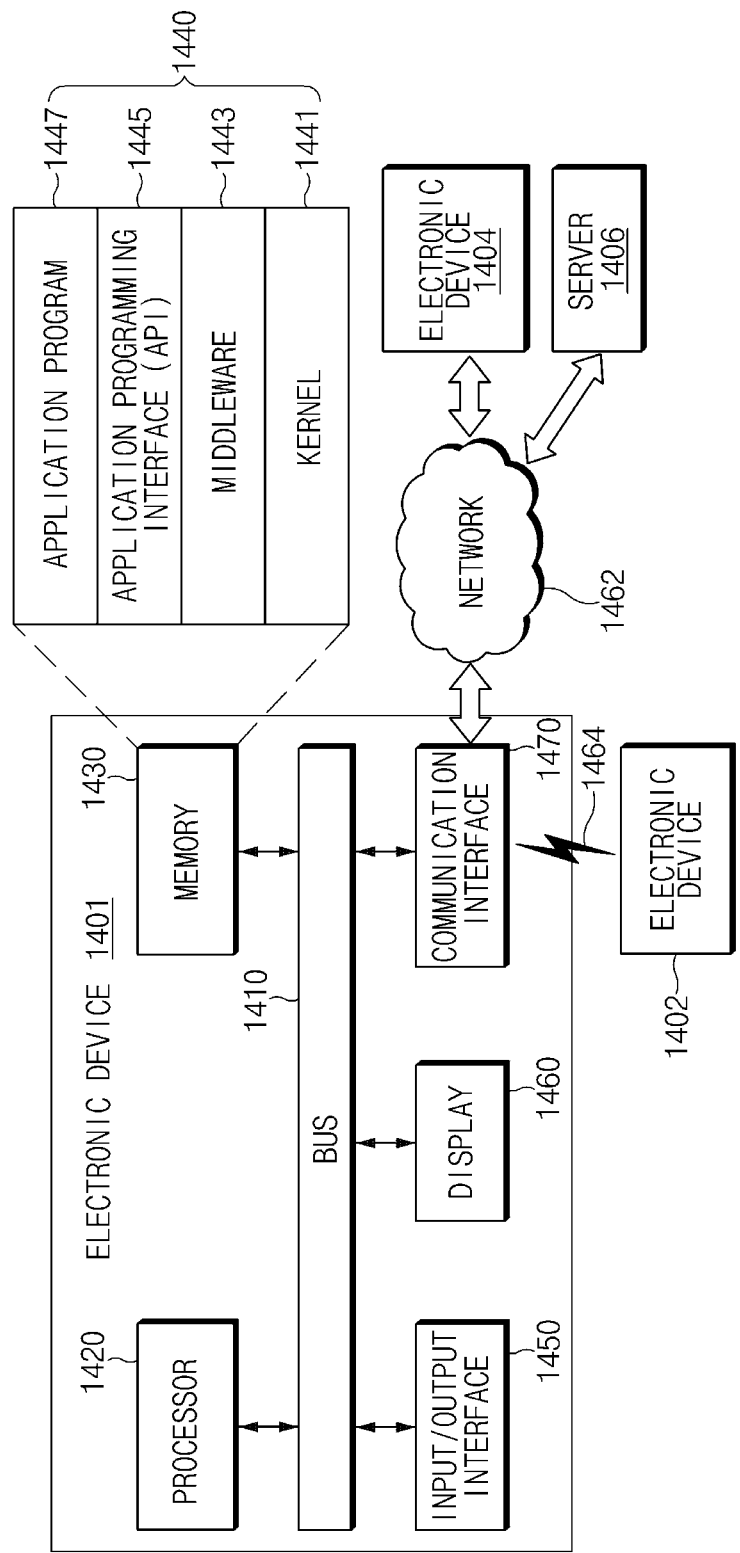
FIG. 14 illustrates a block diagram of the electronic device according to an embodiment of the present disclosure.

FIG. 14 illustrates an electronic device in a network environment system, according to various embodiments.

Referring to FIG. 14, according to various embodiments, an electronic device 1401, a first electronic device 1402, a second electronic device 1404, or a server 1406 may be connected each other over a network 1462 or a short range communication 1464. The electronic device 1401 may include a bus 1410, a processor 1420, a memory 1430, an input/output interface 1450, a display 1460, and a communication interface 1470. According to an embodiment, the electronic device 1401 may not include at least one of the above-described elements or may further include other element(s).

For example, the bus 1410 may interconnect the above-described elements 1410 to 1470 and may include a circuit for conveying communications (e.g., a control message and/or data) among the above-described elements.

The processor 1420 may include one or more of a central processing unit (CPU), an application processor (AP), or a communication processor (CP). For example, the processor 1420 may perform an arithmetic operation or data processing associated with control and/or communication of at least other elements of the electronic device 1401.

The memory 1430 may include a volatile and/or nonvolatile memory. For example, the memory 1430 may store instructions or data associated with at least one other element(s) of the electronic device 1401. According to an embodiment, the memory 1430 may store software and/or a program 1440. The program 1440 may include, for example, a kernel 1441, a middleware 1443, an application programming interface (API) 1445, and/or an application program (or "an application") 1447. At least a part of the kernel 1441, the middleware 1443, or the API 1445 may be referred to as an "operating system (OS)".

For example, the kernel 1441 may control or manage system resources (e.g., the bus 1410, the processor 1420, the memory 1430, and the like) that are used to execute operations or functions of other programs (e.g., the middleware 1443, the API 1445, and the application program 1447). Furthermore, the kernel 1441 may provide an interface that allows the middleware 1443, the API 1445, or the application program 1447 to access discrete elements of the electronic device 1401 so as to control or manage system resources.

The middleware 1443 may perform, for example, a mediation role such that the API 1445 or the application program 1447 communicates with the kernel 1441 to exchange data.

Furthermore, the middleware 1443 may process task requests received from the application program 1447 according to a priority. For example, the middleware 1443 may assign the priority, which makes it possible to use a system resource (e.g., the bus 1410, the processor 1420, the memory 1430, or the like) of the electronic device 1401, to at least one of the application program 1447. For example, the middleware 1443 may process the one or more task requests according to the priority assigned to the at least one, which makes it possible to perform scheduling or load balancing on the one or more task requests.

The API 1445 may be, for example, an interface through which the application program 1447 controls a function provided by the kernel 1441 or the middleware 1443, and may include, for example, at least one interface or function (e.g., an instruction) for a file control, a window control, image processing, a character control, or the like.

The input/output interface 1450 may play a role, for example, of an interface which transmits an instruction or data input from a user or another external device, to other element(s) of the electronic device 1401. Furthermore, the input/output interface 1450 may output an instruction or data, received from other element(s) of the electronic device 1401, to a user or another external device.

The display 1460 may include, for example, a liquid crystal display (LCD), a light-emitting diode (LED) display, an organic LED (OLED) display, a microelectromechanical systems (MEMS) display, or an electronic paper display. The display 1460 may display, for example, various contents (e.g., a text, an image, a video, an icon, a symbol, and the like) to a user. The display 1460 may include a touch screen and may receive, for example, a touch, gesture, proximity, or hovering input using an electronic pen or a part of a user's body.

For example, the communication interface 1470 may establish communication between the electronic device 1401 and an external device (e.g., the first electronic device 1402, the second electronic device 1404, or the server 1406). For example, the communication interface 1470 may be connected to the network 1462 over wireless communication or wired communication to communicate with the external device (e.g., the second electronic device 1404 or the server 1406).

The wireless communication may use at least one of, for example, long-term evolution (LTE), LTE Advanced (LTE-A), Code Division Multiple Access (CDMA), Wideband CDMA (WCDMA), Universal Mobile Telecommunications System (UMTS), Wireless Broadband (WiBro), Global System for Mobile Communications (GSM), or the like, as cellular communication protocol. Furthermore, the wireless communication may include, for example, the short range communication 1464. The short range communication 1464 may include at least one of wireless fidelity (Wi-Fi), Bluetooth, near field communication (NFC), magnetic stripe transmission (MST), a global navigation satellite system (GNSS), or the like.

The MST may generate a pulse in response to transmission data using an electromagnetic signal, and the pulse may generate a magnetic field signal. The electronic device 1401 may transfer the magnetic field signal to point of sale (POS), and the POS may detect the magnetic field signal using a MST reader. The POS may recover the data by converting the detected magnetic field signal to an electrical signal.

The GNSS may include at least one of, for example, a global positioning system (GPS), a global navigation satellite system (Glonass), a Beidou navigation satellite system (hereinafter referred to as "Beidou"), or an European global satellite-based navigation system (hereinafter referred to as "Galileo") based on an available region, a bandwidth, or the like. Hereinafter, in this disclosure, "GPS" and "GNSS" may be interchangeably used. The wired communication may include at least one of, for example, a universal serial bus (USB), a high definition multimedia interface (HDMI), a recommended standard-232 (RS-232), a plain old telephone service (POTS), or the like. The network 1462 may include at least one of telecommunications networks, for example, a computer network (e.g., LAN or WAN), an Internet, or a telephone network.

Each of the first and second electronic devices 1402 and 1404 may be a device of which the type is different from or the same as that of the electronic device 1401. According to an embodiment, the server 1406 may include a group of one or more servers. According to various embodiments, all or a portion of operations that the electronic device 1401 will perform may be executed by another or plural electronic devices (e.g., the first electronic device 1402, the second electronic device 1404 or the server 1406). According to an embodiment, in the case where the electronic device 1401 executes any function or service automatically or in response to a request, the electronic device 1401 may not perform the function or the service internally, but, alternatively additionally, it may request at least a portion of a function associated with the electronic device 1401 from another device (e.g., the electronic device 1402 or 1404 or the server 1406). The other electronic device may execute the requested function or additional function and may transmit the execution result to the electronic device 1401. The electronic device 1401 may provide the requested function or service using the received result or may additionally process the received result to provide the requested function or service. To this end, for example, cloud computing, distributed computing, or client-server computing may be used.

Figure 15:
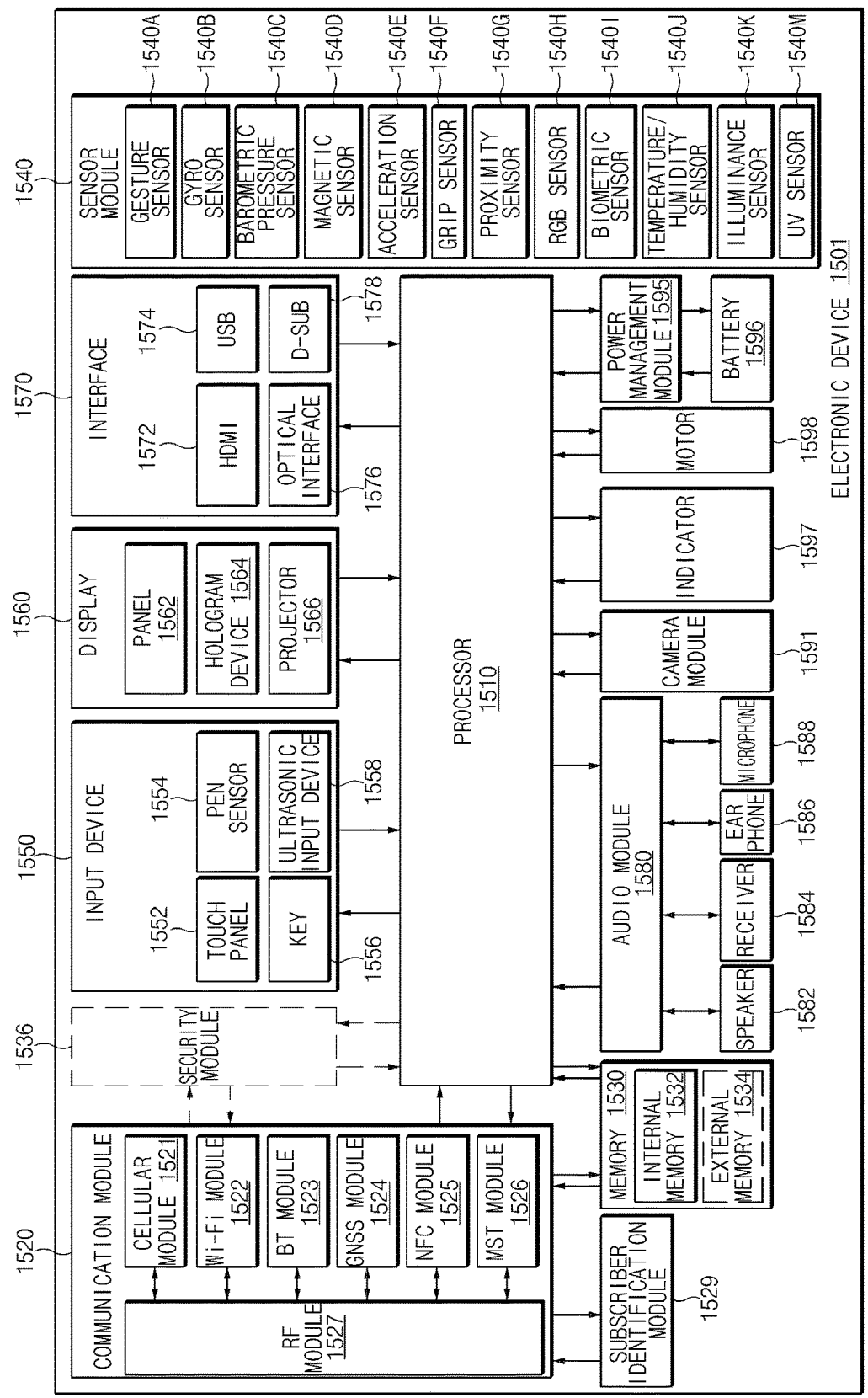
FIG. 15 illustrates a block diagram of the electronic device according to various embodiments.

FIG. 15 illustrates a block diagram of an electronic device, according to various embodiments.

Referring to FIG. 15, an electronic device 1501 may include, for example, all or a part of the electronic device 1401 illustrated in FIG. 14. The electronic device 1501 may include one or more processors (e.g., an application processor (AP)) 1510, a communication module 1520, a subscriber identification module 1529, a memory 1530, a sensor module 1540, an input device 1550, a display 1560, an interface 1570, an audio module 1580, a camera module 1591, a power management module 1595, a battery 1596, an indicator 1597, and a motor 1598.

The processor 1510 may drive, for example, an operating system (OS) or an application to control a plurality of hardware or software elements connected to the processor 1510 and may process and compute a variety of data. For example, the processor 1510 may be implemented with a System on Chip (SoC). According to an embodiment, the processor 1510 may further include a graphic processing unit (GPU) and/or an image signal processor. The processor 1510 may include at least a part (e.g., a cellular module 1521) of elements illustrated in FIG. 15. The processor 1510 may load an instruction or data, which is received from at least one of other elements (e.g., a nonvolatile memory), into a volatile memory and process the loaded instruction or data. The processor 1510 may store a variety of data in the nonvolatile memory.

The communication module 1520 may be configured the same as or similar to the communication interface 1470 of FIG. 14. The communication module 1520 may include the cellular module 1521, a Wi-Fi module 1522, a Bluetooth (BT) module 1523, a GNSS module 1524 (e.g., a GPS module, a Glonass module, a Beidou module, or a Galileo module), a near field communication (NFC) module 1525, a MST module 1526 and a radio frequency (RF) module 1527.

The cellular module 1521 may provide, for example, voice communication, video communication, a character service, an Internet service, or the like over a communication network. According to an embodiment, the cellular module 1521 may perform discrimination and authentication of the electronic device 1501 within a communication network by using the subscriber identification module (e.g., a SIM card) 1529. According to an embodiment, the cellular module 1521 may perform at least a portion of functions that the processor 1510 provides. According to an embodiment, the cellular module 1521 may include a communication processor (CP).

Each of the Wi-Fi module 1522, the BT module 1523, the GNSS module 1524, the NFC module 1525, or the MST module 1526 may include a processor for processing data exchanged through a corresponding module, for example. According to an embodiment, at least a part (e.g., two or more) of the cellular module 1521, the Wi-Fi module 1522, the BT module 1523, the GNSS module 1524, the NFC module 1525, or the MST module 1526 may be included within one Integrated Circuit (IC) or an IC package.

For example, the RF module 1527 may transmit and receive a communication signal (e.g., an RF signal). For example, the RF module 1527 may include a transceiver, a power amplifier module (PAM), a frequency filter, a low noise amplifier (LNA), an antenna, or the like. According to another embodiment, at least one of the cellular module 1521, the Wi-Fi module 1522, the BT module 1523, the GNSS module 1524, the NFC module 1525, or the MST module 1526 may transmit and receive an RF signal through a separate RF module.

The subscriber identification module 1529 may include, for example, a card and/or embedded SIM that includes a subscriber identification module and may include unique identify information (e.g., integrated circuit card identifier (ICCID)) or subscriber information (e.g., integrated mobile subscriber identity (IMSI)).

The memory 1530 (e.g., the memory 1430) may include an internal memory 1532 or an external memory 1534. For example, the internal memory 1532 may include at least one of a volatile memory (e.g., a dynamic random access memory (DRAM), a static RAM (SRAM), a synchronous DRAM (SDRAM), or the like), a nonvolatile memory (e.g., a one-time programmable read only memory (OTPROM), a programmable ROM (PROM), an erasable and programmable ROM (EPROM), an electrically erasable and programmable ROM (EEPROM), a mask ROM, a flash ROM, a flash memory (e.g., a NAND flash memory or a NOR flash memory), or the like), a hard drive, or a solid state drive (SSD).

The external memory 1534 may further include a flash drive such as compact flash (CF), secure digital (SD), micro secure digital (Micro-SD), mini secure digital (Mini-SD), extreme digital (xD), a multimedia card (MMC), a memory stick, or the like. The external memory 1534 may be operatively and/or physically connected to the electronic device 1501 through various interfaces.

A security module 1536 may be a module that includes a storage space of which a security level is higher than that of the memory 1530 and may be a circuit that guarantees safe data storage and a protected execution environment. The security module 1536 may be implemented with a separate circuit and may include a separate processor. For example, the security module 1536 may be in a smart chip or a secure digital (SD) card, which is removable, or may include an embedded secure element (eSE) embedded in a fixed chip of the electronic device 1501. Furthermore, the security module 1536 may operate based on an operating system (OS) that is different from the OS of the electronic device 1501. For example, the security module 1536 may operate based on java card open platform (JCOP) OS.

The sensor module 1540 may measure, for example, a physical quantity or may detect an operation state of the electronic device 1501. The sensor module 1540 may convert the measured or detected information to an electric signal. For example, the sensor module 1540 may include at least one of a gesture sensor 1540A, a gyro sensor 1540B, a barometric pressure sensor 1540C, a magnetic sensor 1540D, an acceleration sensor 1540E, a grip sensor 1540F, the proximity sensor 1540G, a color sensor 1540H (e.g., red, green, blue (RGB) sensor), a biometric sensor 1540I, a temperature/humidity sensor 1540J, an illuminance sensor 1540K, or an UV sensor 1540M. Although not illustrated, additionally or generally, the sensor module 1540 may further include, for example, an E-nose sensor, an electromyography (EMG) sensor, an electroencephalogram (EEG) sensor, an electrocardiogram (ECG) sensor, an infrared (IR) sensor, an iris sensor, and/or a fingerprint sensor. The sensor module 1540 may further include a control circuit for controlling at least one or more sensors included therein. According to an embodiment, the electronic device 1501 may further include a processor that is a part of the processor 1510 or independent of the processor 1510 and is configured to control the sensor module 1540. The processor may control the sensor module 1540 while the processor 1510 remains at a sleep state.

The input device 1550 may include, for example, a touch panel 1552, a (digital) pen sensor 1554, a key 1556, or an ultrasonic input device 1558. For example, the touch panel 1552 may use at least one of capacitive, resistive, infrared and ultrasonic detecting methods. Also, the touch panel 1552 may further include a control circuit. The touch panel 1552 may further include a tactile layer to provide a tactile reaction to a user.

The (digital) pen sensor 1554 may be, for example, a part of a touch panel or may include an additional sheet for recognition. The key 1556 may include, for example, a physical button, an optical key, a keypad, or the like. The ultrasonic input device 1558 may detect (or sense) an ultrasonic signal, which is generated from an input device, through a microphone (e.g., a microphone 1588) and may check data corresponding to the detected ultrasonic signal.

The display 1560 (e.g., the display 1460) may include a panel 1562, a hologram device 1564, or a projector 1566. The panel 1562 may be the same as or similar to the display 1460 illustrated in FIG. 14. The panel 1562 may be implemented, for example, to be flexible, transparent or wearable. The panel 1562 and the touch panel 1552 may be integrated into a single module. The hologram device 1564 may display a stereoscopic image in a space using a light interference phenomenon. The projector 1566 may project light onto a screen so as to display an image. For example, the screen may be arranged in the inside or the outside of the electronic device 1501. According to an embodiment, the display 1560 may further include a control circuit for controlling the panel 1562, the hologram device 1564, or the projector 1566.

The interface 1570 may include, for example, a high-definition multimedia interface (HDMI) 1572, a universal serial bus (USB) 1574, an optical interface 1576, or a D-subminiature (D-sub) 1578. The interface 1570 may be included, for example, in the communication interface 1470 illustrated in FIG. 14. Additionally or generally, the interface 1570 may include, for example, a mobile high definition link (MHL) interface, a SD card/multi-media card (MMC) interface, or an infrared data association (IrDA) standard interface.

The audio module 1580 may convert a sound and an electric signal in dual directions. At least a part of the audio module 1580 may be included, for example, in the input/output interface 1450 illustrated in FIG. 14. The audio module 1580 may process, for example, sound information that is input or output through a speaker 1582, a receiver 1584, an earphone 1586, or the microphone 1588.

For example, the camera module 1591 may shoot a still image or a video. According to an embodiment, the camera module 1591 may include at least one or more image sensors (e.g., a front sensor or a rear sensor), a lens, an image signal processor (ISP), or a flash (e.g., an LED or a xenon lamp).

The power management module 1595 may manage, for example, power of the electronic device 1501. According to an embodiment, a power management integrated circuit (PMIC), a charger IC, or a battery or fuel gauge may be included in the power management module 1595. The PMIC may have a wired charging method and/or a wireless charging method. The wireless charging method may include, for example, a magnetic resonance method, a magnetic induction method or an electromagnetic method and may further include an additional circuit, for example, a coil loop, a resonant circuit, or a rectifier, and the like. The battery gauge may measure, for example, a remaining capacity of the battery 1596 and a voltage, current or temperature thereof while the battery is charged. The battery 1596 may include, for example, a rechargeable battery and/or a solar battery.

The indicator 1597 may display a specific state of the electronic device 1501 or a part thereof (e.g., the processor 1510), such as a booting state, a message state, a charging state, and the like. The motor 1598 may convert an electrical signal into a mechanical vibration and may generate the following effects: vibration, haptic, and the like. Although not illustrated, a processing device (e.g., a GPU) for supporting a mobile TV may be included in the electronic device 1501. The processing device for supporting the mobile TV may process media data according to the standards of digital multimedia broadcasting (DMB), digital video broadcasting (DVB), MediaFlo™, or the like.

Each of the above-mentioned elements of the electronic device according to various embodiments of the present disclosure may be configured with one or more components, and the names of the elements may be changed according to the type of the electronic device. In various embodiments, the electronic device may include at least one of the above-mentioned elements, and some elements may be omitted or other additional elements may be added. Furthermore, some of the elements of the electronic device according to various embodiments may be combined with each other so as to form one entity, so that the functions of the elements may be performed in the same manner as before the combination.

Figure 16:
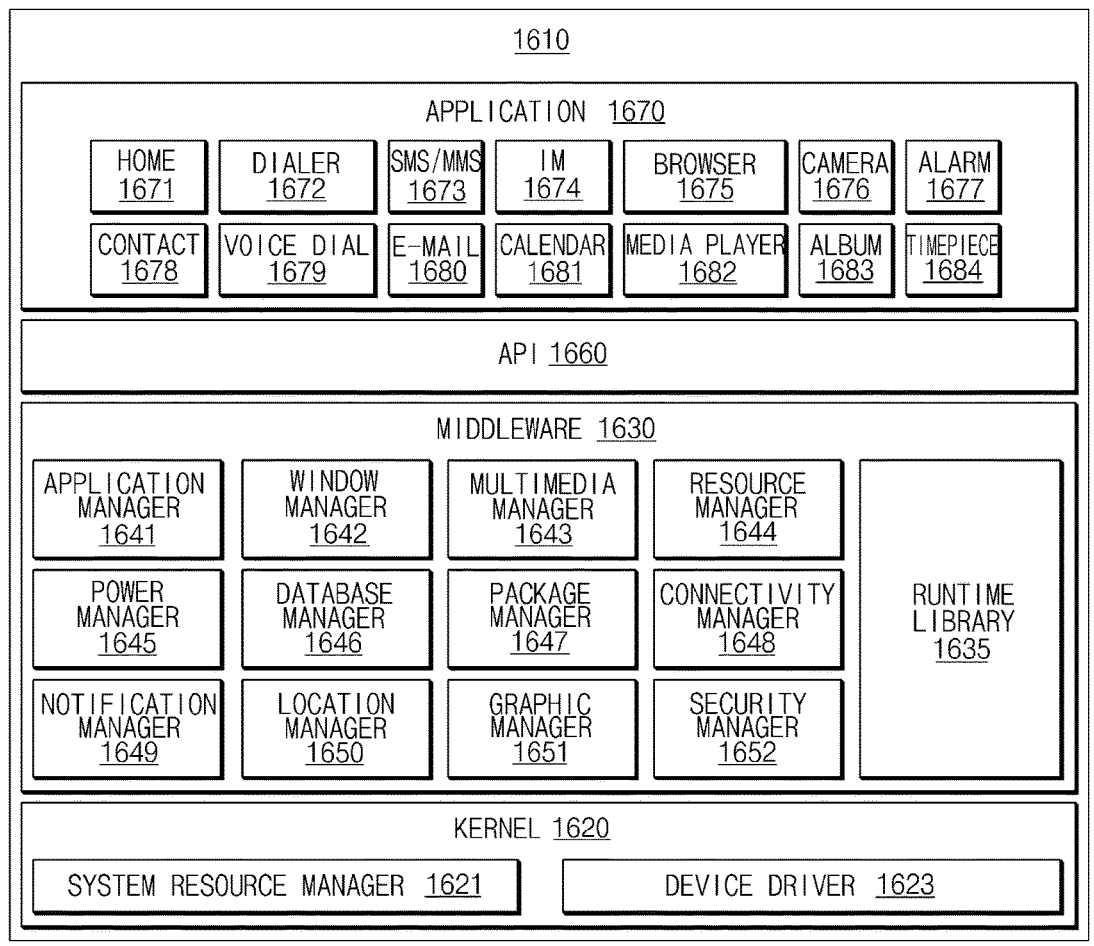
FIG. 16 illustrates a block diagram of a program module according to various embodiments.

FIG. 16 illustrates a block diagram of a program module, according to various embodiments.

According to an embodiment, a program module 1610 (e.g., the program 1440) may include an operating system (OS) to control resources associated with an electronic device (e.g., the electronic device 1401), and/or diverse applications (e.g., the application program 1447) driven on the OS. The OS may be, for example, Android, iOS, Windows, Symbian, or Tizen.

The program module 1610 may include a kernel 1620, a middleware 1630, an application programming interface (API) 1660, and/or an application 1670. At least a portion of the program module 1610 may be preloaded on an electronic device or may be downloadable from an external electronic device (e.g., the first electronic device 1402, the second electronic device 1404, the server 1406, or the like).

The kernel 1620 (e.g., the kernel 1441) may include, for example, a system resource manager 1621 or a device driver 1623. The system resource manager 1621 may perform control, allocation, or retrieval of system resources. According to an embodiment, the system resource manager 1621 may include a process managing unit, a memory managing unit, or a file system managing unit. The device driver 1623 may include, for example, a display driver, a camera driver, a Bluetooth driver, a shared memory driver, a USB driver, a keypad driver, a Wi-Fi driver, an audio driver, or an inter-process communication (IPC) driver.

The middleware 1630 may provide, for example, a function that the application 1670 uses in common, or may provide diverse functions to the application 1670 through the API 1660 to allow the application 1670 to efficiently use limited system resources of the electronic device. According to an embodiment, the middleware 1630 (e.g., the middleware 1443) may include at least one of a runtime library 1635, an application manager 1641, a window manager 1642, a multimedia manager 1643, a resource manager 1644, a power manager 1645, a database manager 1646, a package manager 1647, a connectivity manager 1648, a notification manager 1649, a location manager 1650, a graphic manager 1651, a security manager 1652, or a payment manager 1654.

The runtime library 1635 may include, for example, a library module that is used by a compiler to add a new function through a programming language while the application 1670 is being executed. The runtime library 1635 may perform input/output management, memory management, or capacities about arithmetic functions.

The application manager 1641 may manage, for example, a life cycle of at least one application of the application 1670. The window manager 1642 may manage a graphic user interface (GUI) resource that is used in a screen. The multimedia manager 1643 may identify a format for playing diverse media files, and may perform encoding or decoding of media files by using a codec suitable for the format. The resource manager 1644 may manage resources such as a storage space, memory, or source code of at least one application of the application 1670.

The power manager 1645 may operate, for example, with a basic input/output system (BIOS) to manage a battery or power, and may provide power information for an operation of an electronic device. The database manager 1646 may generate, search for, or modify database that is to be used in at least one application of the application 1670. The package manager 1647 may install or update an application that is distributed in the form of package file.

The connectivity manager 1648 may manage, for example, wireless connection such as Wi-Fi or Bluetooth. The notification manager 1649 may display or notify an event such as arrival message, appointment, or proximity notification in a mode that does not disturb a user. The location manager 1650 may manage location information about an electronic device. The graphic manager 1651 may manage a graphic effect that is provided to a user, or manage a user interface relevant thereto. The security manager 1652 may provide a general security function for system security, user authentication, or the like. According to an embodiment, in the case where an electronic device (e.g., the electronic device 1401) includes a telephony function, the middleware 1630 may further include a telephony manager for managing a voice or video call function of the electronic device.

The middleware 1630 may include a middleware module that combines diverse functions of the above-described elements. The middleware 1630 may provide a module specialized to each OS kind to provide differentiated functions. Additionally, the middleware 1630 may dynamically remove a part of the preexisting elements or may add new elements thereto.

The API 1660 (e.g., the API 1445) may be, for example, a set of programming functions and may be provided with a configuration that is variable depending on an OS. For example, in the case where an OS is the android or the iOS, it may provide one API set per platform. In the case where an OS is the tizen, it may provide two or more API sets per platform.

The application 1670 (e.g., the application program 1447) may include, for example, one or more applications capable of providing functions for a home 1671, a dialer 1672, an SMS/MMS 1673, an instant message (IM) 1674, a browser 1675, a camera 1676, an alarm 1677, a contact 1678, a voice dial 1679, an e-mail 1680, a calendar 1681, a media player 1682, an album 1683, and a timepiece 1684 or for offering health care (e.g., measuring an exercise quantity, blood sugar, or the like) or environment information (e.g., information of barometric pressure, humidity, temperature, or the like).

According to an embodiment, the application 1670 may include an application (hereinafter referred to as "information exchanging application" for descriptive convenience) to support information exchange between an electronic device (e.g., the electronic device 1401) and an external electronic device (e.g., the first electronic device 1402 or the second electronic device 1404). The information exchanging application may include, for example, a notification relay application for transmitting specific information to an external electronic device, or a device management application for managing the external electronic device.

For example, the notification relay application may include a function of transmitting notification information, which arise from other applications (e.g., applications for SMS/MMS, e-mail, health care, or environmental information), to an external electronic device. Additionally, the information exchanging application may receive, for example, notification information from an external electronic device and provide the notification information to a user.

The device management application may manage (e.g., install, delete, or update), for example, at least one function (e.g., turn-on/turn-off of an external electronic device itself (or a part of elements) or adjustment of brightness (or resolution) of a display) of the external electronic device which communicates with the electronic device, an application running in the external electronic device, or a service (e.g., a call service, a message service, or the like) provided from the external electronic device.

According to an embodiment, the application 1670 may include an application (e.g., a health care application of a mobile medical device) that is assigned in accordance with an attribute of an external electronic device. According to an embodiment, the application 1670 may include an application that is received from an external electronic device (e.g., the first electronic device 1402, the second electronic device 1404, or the server 1406). According to an embodiment, the application 1670 may include a preloaded application or a third party application that is downloadable from a server. The names of elements of the program module 1610 according to the embodiment may be modifiable depending on kinds of operating systems.

According to various embodiments, at least a portion of the program module 1610 may be implemented by software, firmware, hardware, or a combination of two or more thereof. At least a portion of the program module 1610 may be implemented (e.g., executed), for example, by the processor (e.g., the processor 1510). At least a portion of the program module 1610 may include, for example, modules, programs, routines, sets of instructions, processes, or the like for performing one or more functions.

The term "module" used in this disclosure may represent, for example, a unit including one or more combinations of hardware, software and firmware. The term "module" may be interchangeably used with the terms "unit", "logic", "logical block", "component" and "circuit". The "module" may be a minimum unit of an integrated component or may be a part thereof. The "module" may be a minimum unit for performing one or more functions or a part thereof. The "module" may be implemented mechanically or electronically. For example, the "module" may include at least one of an application-specific IC (ASIC) chip, a field-programmable gate array (FPGA), and a programmable-logic device for performing some operations, which are known or will be developed.

At least a part of an apparatus (e.g., modules or functions thereof) or a method (e.g., operations) according to various embodiments may be, for example, implemented by instructions stored in a computer-readable storage media in the form of a program module. The instruction, when executed by a processor (e.g., the processor 1420), may cause the one or more processors to perform a function corresponding to the instruction. The computer-readable storage media, for example, may be the memory 1430.

A computer-readable recording medium may include a hard disk, a floppy disk, a magnetic media (e.g., a magnetic tape), an optical media (e.g., a compact disc read only memory (CD-ROM) and a digital versatile disc (DVD), a magneto-optical media (e.g., a floptical disk)), and hardware devices (e.g., a read only memory (ROM), a random access memory (RAM), or a flash memory). Also, a program instruction may include not only a mechanical code such as things generated by a compiler but also a high-level language code executable on a computer using an interpreter. The above hardware unit may be configured to operate via one or more software modules for performing an operation according to various embodiments, and vice versa.

A module or a program module according to various embodiments may include at least one of the above elements, or a part of the above elements may be omitted, or additional other elements may be further included. Operations performed by a module, a program module, or other elements according to various embodiments may be executed sequentially, in parallel, repeatedly, or in a heuristic method. In addition, some operations may be executed in different sequences or may be omitted. Alternatively, other operations may be added.

While the present disclosure has been shown and described with reference to various embodiments thereof, it will be understood by those skilled in the art that various changes in form and details may be made therein without departing from the spirit and scope of the present disclosure as defined by the appended claims and their equivalents.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. An electronic device from which an accessory including at least one magnet is removable, comprising:
   a housing including a front housing, the front housing capable of being covered by at least a part of the accessory and a rear housing from which at least another part of the accessory is removable;
   a display exposed through at least a part of the front housing;
   an electromagnetic induction panel disposed inside the housing, the electromagnetic induction panel including
   a first channel group corresponding to a first direction and
   a second channel group corresponding to a second direction perpendicular to the first direction,
   wherein the electromagnetic induction panel is configured to sense a first signal flowing into the first channel group and a second signal flowing into the second channel group; and
   a processor disposed inside the housing and electrically connected to the electromagnetic induction panel, wherein the processor is configured to:
   sense that a magnitude of the first signal flowing into at least one first channel in the first channel group is not greater than a first critical value;
   sense that a magnitude of the second signal flowing into at least one second channel in the second channel group is not greater than a second critical value; and
   if a combination of the at least one first channel and the at least one second channel corresponds to one of predefined channel combinations, perform a preset operation.

2. The electronic device of claim 1, wherein the processor is further configured to:
   if the combination of the at least one first channel and the at least one second channel corresponds to one of the predefined channel combinations, sense that the accessory is attached to the electronic device.

3. The electronic device of claim 2, wherein the processor is further configured to:
   sense a type of the accessory based on the combination of the at least one first channel and the at least one second channel.

4. The electronic device of claim 1, wherein the preset operation includes turning off the display.

5. The electronic device of claim 1, wherein the preset operation includes displaying a screen in the display in a landscape mode.

6. The electronic device of claim 1, wherein the preset operation includes displaying a soft input panel (SIP) in the display.

7. The electronic device of claim 1, wherein the processor is further configured to:
   if the combination of the at least one first channel and the at least one second channel corresponds to a first channel combination being one of the predefined channel combinations, display a first user interface in the display; and
   if the combination of the at least one first channel and the at least one second channel corresponds to a second channel combination being one of the predefined channel combinations, display a second user interface in the display,
   wherein at least one first channel constituting the first channel combination is the same as at least one first channel constituting the second channel combination, and
   wherein at least one second channel constituting the first channel combination is different from at least one second channel constituting the second channel combination.

8. The electronic device of claim 7, wherein the processor is further configured to:
   apply a different correction value to a location of a pen input device based on a channel combination of the at least one first channel and the at least one second channel, wherein the electromagnetic induction panel senses the location of the pen input device.

9. The electronic device of claim 1, wherein the processor is further configured to:
   if the magnitude of the first signal of the at least one first channel and the magnitude of the second signal of the at least one second channel satisfy a first range, perform a first operation; and
   if the magnitude of the first signal of the at least one first channel and the magnitude of the second signal of the at least one second channel satisfy a second range, perform a second operation distinguished from the first operation.

10. The electronic device of claim 1, wherein:
    the accessory is a cover of the electronic device;
    at least a part of the accessory is a front cover of the cover; and
    at least another part of the accessory is a back cover of the cover.

11. An electronic device from which an accessory including at least one magnet is removable, comprising:
    a housing including a front housing covered by the accessory;
    a display exposed through at least a part of the front housing;
    an electromagnetic induction panel disposed inside the housing, the electromagnetic induction panel including
    a first channel group corresponding to a first direction and
    a second channel group corresponding to a second direction perpendicular to the first direction,
    wherein the electromagnetic induction panel is configured to sense a first signal flowing into the first channel group and a second signal flowing into the second channel group; and
    a processor disposed inside the housing and electrically connected to the electromagnetic induction panel, wherein the processor is configured to:
    sense that a magnitude of the first signal flowing into at least one first channel in the first channel group is not greater than a first critical value;

sense that a magnitude of the second signal flowing into at least one second channel in the second channel group is not greater than a second critical value; and if a combination of the at least one first channel and the at least one second channel corresponds to one of predefined channel combinations, perform a preset operation.

12. The electronic device of claim 11, wherein the preset operation includes turning off the display.

13. The electronic device of claim 11, wherein the processor is further configured to:

if the combination of the at least one first channel and the at least one second channel corresponds to one of the predefined channel combinations, sense that the accessory is attached to the electronic device.

14. The electronic device of claim 11, wherein the processor is further configured to:

if the combination of the at least one first channel and the at least one second channel corresponds to a first channel combination being one of the predefined channel combinations, display a first user interface in the display; and if the combination of the at least one first channel and the at least one second channel corresponds to a second channel combination being one of the predefined channel combinations, display a second user interface in the display, wherein at least one first channel constituting the first channel combination is the same as at least one first channel constituting the second channel combination, and wherein at least one second channel constituting the first channel combination is different from at least one second channel constituting the second channel combination.

15. The electronic device of claim 11, wherein the processor is further configured to:

if the magnitude of the first signal of the at least one first channel and the magnitude of the second signal of the at least one second channel satisfy a first range, perform a first operation; and if the magnitude of the first signal of the at least one first channel and the magnitude of the second signal of the at least one second channel satisfy a second range, perform a second operation distinguished from the first operation.

16. A method of an electronic device, the method comprising:

sensing that a magnitude of a first signal flowing into at least one first channel in a first channel group of an electromagnetic induction panel is not greater than a first critical value;

sensing that a magnitude of a second signal flowing into at least one second channel in a second channel group of the electromagnetic induction panel is not greater than a second critical value; and if a combination of the at least one first channel and the at least one second channel corresponds to one of predefined channel combinations, performing a preset operation.

17. The method of claim 16, wherein the preset operation includes turning off a display of the electronic device.

18. The method of claim 16, further comprising:

if the combination of the at least one first channel and the at least one second channel corresponds to one of the predefined channel combinations, sensing that an accessory is attached to the electronic device.

19. The method of claim 16, further comprising:

if the combination of the at least one first channel and the at least one second channel corresponds to a first channel combination being one of the predefined channel combinations, displaying a first user interface in the display; and if the combination of the at least one first channel and the at least one second channel corresponds to a second channel combination being one of the predefined channel combinations, displaying a second user interface in the display, wherein at least one first channel constituting the first channel combination is the same as at least one first channel constituting the second channel combination, and wherein at least one second channel constituting the first channel combination is different from at least one second channel constituting the second channel combination.

20. The method of claim 16, further comprising:

if the magnitude of the first signal of the at least one first channel and the magnitude of the second signal of the at least one second channel satisfy a first range, performing a first operation; and if the magnitude of the first signal of the at least one first channel and the magnitude of the second signal of the at least one second channel satisfy a second range, performing a second operation distinguished from the first operation.

* * * * *